United States Patent
Sakata et al.

(10) Patent No.: US 9,530,968 B2
(45) Date of Patent: Dec. 27, 2016

(54) LIGHT EMITTING ELEMENT AND LIGHT EMITTING DEVICE

(75) Inventors: Junichiro Sakata, Kanagawa (JP); Takahiro Kawakami, Kanagawa (JP); Hisao Ikeda, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 30 days.

(21) Appl. No.: 11/351,713

(22) Filed: Feb. 10, 2006

(65) Prior Publication Data

US 2006/0180812 A1    Aug. 17, 2006

(30) Foreign Application Priority Data

Feb. 15, 2005    (JP) ................. 2005-037090

(51) Int. Cl.
*H01L 29/08* (2006.01)
*H01L 51/00* (2006.01)
(Continued)

(52) U.S. Cl.
CPC ......... *H01L 51/006* (2013.01); *H01L 51/5012* (2013.01); *H01L 27/3244* (2013.01);
(Continued)

(58) Field of Classification Search
CPC ...... H01L 29/08; H01L 51/50; H01L 51/5008; H01L 51/5048; H01L 51/5052; H01L 51/5056; H01L 51/506; H01L 51/5068; H01L 51/5088; H01L 51/52
(Continued)

(56) References Cited

U.S. PATENT DOCUMENTS 5,231,329 A * 7/1993 Nishikitani et al. .......... 313/503
5,354,997 A * 10/1994 Miller ........................ 250/484.5
(Continued)

FOREIGN PATENT DOCUMENTS

CN    1447629 A    10/2003
CN    1604696       4/2005
(Continued)

OTHER PUBLICATIONS

Maree et al., Accurate thickness/density measurements of organic light-emitting diodes, Journal of Applied Physics, vol. 84, No. 7, Oct. 1998, pp. 4013-4016.*
(Continued)

*Primary Examiner* — Peniel M Gumedzoe
(74) *Attorney, Agent, or Firm* — Husch Blackwell LLP

(57) ABSTRACT

The present invention provides a light emitting element whose driving voltage is low, and a light emitting element having longer lifetime. Moreover, the invention provides a light emitting element with high manufacturing yield. A light emitting element has a layer containing an organic material and an inorganic material, wherein activation energy of electrical conductivity of the layer containing the organic material and the inorganic material, is 0.01 eV or more and less than 0.30 eV. Preferably, the activation energy of electrical conductivity of the layer containing the organic material and the inorganic material, is 0.01 eV or more and less than 0.26 eV. More preferably, the activation energy of the electrical conductivity of the layer containing the organic material and the inorganic material, is 0.01 eV or more and less than 0.20 eV.

18 Claims, 20 Drawing Sheets

(51) Int. Cl.
*H01L 51/50* (2006.01)
*H01L 27/32* (2006.01)

(52) U.S. Cl.
CPC .. *H01L 51/0059* (2013.01); *H01L 2251/5315* (2013.01); *H01L 2251/5323* (2013.01)

(58) Field of Classification Search
USPC .......................... 257/40, E51.018, E51.022
See application file for complete search history.

(56) References Cited

U.S. PATENT DOCUMENTS

| | | | |
|---|---|---|---|
| 5,674,597 A * | 10/1997 | Fujii et al. | 428/212 |
| 5,783,292 A * | 7/1998 | Tokito et al. | 428/212 |
| 5,858,562 A * | 1/1999 | Utsugi et al. | 428/690 |
| 5,989,737 A | 11/1999 | Xie et al. | 428/690 |
| 6,303,239 B1 | 10/2001 | Arai et al. | |
| 6,313,261 B1 * | 11/2001 | Samuel et al. | 528/378 |
| 6,589,673 B1 | 7/2003 | Kido et al. | 428/690 |
| 6,771,018 B2 * | 8/2004 | Toguchi et al. | 313/498 |
| 7,462,883 B2 | 12/2008 | Kumaki et al. | |
| 7,541,734 B2 | 6/2009 | Yamazaki et al. | |
| 7,893,427 B2 | 2/2011 | Kumaki et al. | |
| 7,964,891 B2 | 6/2011 | Kumaki et al. | |
| 8,008,651 B2 | 8/2011 | Kumaki et al. | |
| 8,008,652 B2 | 8/2011 | Kumaki et al. | |
| 8,138,667 B2 | 3/2012 | Yamazaki et al. | |
| 8,368,059 B2 | 2/2013 | Kumaki et al. | |
| 8,368,060 B2 | 2/2013 | Kumaki et al. | |
| 8,502,210 B2 | 8/2013 | Kumaki et al. | |
| 8,618,574 B2 | 12/2013 | Kumaki et al. | |
| 8,643,003 B2 | 2/2014 | Kumaki et al. | |
| 8,796,670 B2 | 8/2014 | Kumaki et al. | |
| 8,872,169 B2 | 10/2014 | Kumaki et al. | |
| 2001/0006827 A1 | 7/2001 | Yamazaki et al. | |
| 2001/0046611 A1 | 11/2001 | Kido et al. | 428/690 |
| 2002/0086180 A1* | 7/2002 | Seo et al. | 428/690 |
| 2002/0136922 A1* | 9/2002 | Sakai et al. | 428/690 |
| 2003/0180447 A1* | 9/2003 | Meth | 427/68 |
| 2003/0189401 A1* | 10/2003 | Kido et al. | 313/504 |
| 2004/0119403 A1* | 6/2004 | McCormick et al. | 313/506 |
| 2004/0222737 A1* | 11/2004 | Raychaudhuri et al. | 313/504 |
| 2004/0247933 A1* | 12/2004 | Thoms | 428/690 |
| 2005/0037234 A1* | 2/2005 | Kim et al. | 428/690 |
| 2005/0073247 A1* | 4/2005 | Yamazaki et al. | 313/503 |
| 2005/0084712 A1 | 4/2005 | Kido et al. | |
| 2005/0098207 A1* | 5/2005 | Matsumoto et al. | 136/263 |
| 2005/0106419 A1* | 5/2005 | Endoh | H01L 51/5048 428/690 |
| 2005/0136288 A1* | 6/2005 | Lee et al. | 428/690 |
| 2005/0139823 A1* | 6/2005 | Hirakata | B82Y 10/00 257/40 |
| 2005/0162075 A1* | 7/2005 | Madathil et al. | 313/504 |
| 2005/0170208 A1 | 8/2005 | Yatsunami et al. | |
| 2005/0208330 A1* | 9/2005 | Raychaudhuri et al. | 428/690 |
| 2005/0248267 A1 | 11/2005 | Gyoutoku et al. | |
| 2006/0008740 A1 | 1/2006 | Kido et al. | |
| 2007/0182317 A1 | 8/2007 | Kido et al. | |
| 2011/0156030 A1 | 6/2011 | Kumaki et al. | |
| 2012/0181522 A1 | 7/2012 | Yamazaki et al. | |
| 2015/0035000 A1 | 2/2015 | Kumaki et al. | |

FOREIGN PATENT DOCUMENTS

| | | |
|---|---|---|
| CN | 1610470 A | 4/2005 |
| EP | 1 351 558 A1 | 10/2003 |
| EP | 1 524 706 A2 | 4/2005 |
| JP | 09-063771 | 3/1997 |
| JP | 9-301934 | 11/1997 |
| JP | 11-307259 | 11/1999 |
| JP | 2003-272860 | 9/2003 |
| JP | 2005-26121 | 1/2005 |
| WO | WO 2005/031798 A2 | 4/2005 |

OTHER PUBLICATIONS

Denisty of Molybdenum Oxide, [online], [retrieved on Nov. 13, 2007] retrieved from the internet: <URL: http://www.webelements.com/webelements/compunds >.*

Definition of "mixture", [online], [retrieved on Jun. 2, 2008] retrieved from the internet: <URL: http://www.merriam-webster.com/>.*

Molybdenum Oxide physical properties, [online], [retrieved on Jun. 2, 2008] retrieved from the internet: <URL: http://www.webelements.com/compounds/molybdenum/molybdenum_trioxide.html>.*

He et al., Photochromism of Molybdenum Oxide, Journal of Photochemistry and Photobiology, No. 4, p. 125-143, 2003.*

Chemical and Physical Properties of NPD, retrieved via ACS on STN, Oct. 8, 2010.*

English Machine Translation of JP 2005-026121 by Ikuo et al., retrieved online Jun. 16, 2013.*

Benzidine Derivative, and Light-Emitting Device and Electric Appliance Using the Benzidine Dernative As the Hole Transporting Material, WO 2005/121064, by Kawakami S., published Dec. 22, 2005.*

Shirota, Y. et al, "Multilayered Organic Electroluminescent Device Using a Novel Starburst Molecule, 4,4',4"-tris(3-Methylpenylphenylamino) Triphenylamine, as a Hole Transport Material," Appl. Phys. Lett., vol. 65, No. 7, pp. 807-809, Aug. 15, 1994.

Tokito, S. et al, "Metal Oxides as a Hole-Injecting Layer for an Organic Electroluminescent Device," J. Phys. D. Appl. Phys., vol. 29, pp. 2750-2753 (1996).

Yamamori, A. et al, "Doped Organic Light Emitting Diodes Having a 650-nm-Thick Hole Transport Layer," Appl. Phys. Lett., vol. 72, No. 17, pp. 2147-2149, Apr. 27, 1998.

Iwanami, *Dictionary of Physics and Chemistry*, 4th edition, Oct. 12, 1987, p. 237 (in Japanese).

Baifukan, *Revised Dictionary of Physics*, reduced edition, Oct. 30, 1992, p. 354 (in Japanese).

Office Action re Chinese application No. CN 201010165351.X, dated Jan. 20, 2011 (with English translation).

Office Action re (Chinese Application No. CN 201010165351.X; dated Oct. 29, 2012 (with English translation).

* cited by examiner

LIGHT EMITTING ELEMENT AND LIGHT EMITTING DEVICE

BACKGROUND OF THE INVENTION

1. Field of the Invention

The present invention relates to a light emitting element having a structure in which a plurality of layers are interposed between a pair of electrodes. Moreover, the present invention relates to a light emitting device having the light emitting element.

2. Description of the Related Art

A light emitting device utilizing light emitted from an electroluminescence element (a light emitting element) has been attracting attention as a display device or a lighting device.

As a light emitting element used for a light emitting device, a light emitting element in which a layer containing a light emitting compound is interposed between a pair of electrodes, is well known.

In such a light emitting element, one of the pair of electrodes serves as an anode and the other electrode serves as a cathode. Holes injected from the anode and electrons injected from the cathode are recombined to form excited molecules, and the light emitting element emits light when the excited molecules return to a ground state.

Meanwhile, demands for reduction in power consumption of display devices to be incorporated in various kinds of information processing apparatuses which have been rapidly developed, have been increased. In order to reduce the power consumption, it has been attempted to reduce driving voltage of a light emitting element. From the viewpoint of product commercialization, it is also important to prolong lifetime of a light emitting element in addition to the reduction in driving voltage. Development of a light emitting element has been carried out to overcome the above problems.

For example, in Japanese Patent Application Laid-Open No. Hei 9-63771 (the patent document 1), the reduction in driving voltage of a light emitting element is achieved by using-metal oxide having a high work function such as molybdenum oxide, as an anode (see the patent document 1).

However, only the means disclosed in the patent document 1 is not sufficient to prolong lifetime of a light emitting element. Therefore, development of a technique for achieving longer lifetime of a light emitting element, has been required.

In addition, since a light emitting element is generally formed using a thin organic film, for example, with a thickness of about 0.1 μm, the light emitting element has a problem that an upper electrode and a lower electrode are easily short-circuited to each other. In particular, low yield due to dust generated in a process of manufacturing a light emitting element, becomes a problem.

SUMMARY OF THE INVENTION

In view of the above problems, an object of the present invention is to provide a light emitting element with low driving voltage, a light emitting element having longer lifetime, and a light emitting element with high manufacturing yield. Moreover, another object of the present invention is to provide a light emitting device having the light emitting element.

The present inventors founded that the above objects can be solved by using a layer having low activation energy of electrical conductivity, for a light emitting element.

In an aspect of the present invention, a light emitting element has a layer containing both an organic material and an inorganic material, between a pair of electrodes, wherein activation energy of electrical conductivity of the layer containing both the organic material and the inorganic material, is 0.01 eV or more and less than 0.30 eV. Preferably, the activation energy of electrical conductivity of the layer containing the organic material and the inorganic material, is 0.01 eV or more and less than 0.26 eV. More preferably, the activation energy of the electrical conductivity thereof is 0.01 eV or more and less than 0.20 eV.

In another aspect of the invention, a light emitting element has a layer containing both an organic material and an inorganic material, between a pair of electrodes, wherein the layer containing the organic material and the inorganic material, does not have an absorption peak in a visible light region, and the concentration of the inorganic material is 30 to 95 wt %.

In the above structure, an activation energy of the layer containing both an organic material and an inorganic material is 0.01 eV or over and less than 0.20 eV.

In a case where the layer containing the organic material and the inorganic material does not have an absorption peak in a visible light region, 4,4'-bis(N-{4-[N,N'-bis(3-methylphenyl)amino]phenyl}-N-phenylamino)biphenyl (abbreviation: DNTPD); 4,4'-bis[N-(4-diphenylaminophenyl)-N-phenylamino]biphenyl (abbreviation: DPAB); and the like can be given as the organic material.

In still another aspect of the invention, a light emitting element has a layer containing both an organic material and an inorganic material, between a pair of electrodes, wherein the layer containing the organic material and the inorganic material has an absorption peak in a visible light region, and a concentration of the inorganic material is 5 to 95 wt %.

In the above structure, an activation energy of the layer containing both an organic material and an inorganic material is 0.01 eV or over and less than 0.30 eV, preferably, 0.01 eV or more and less than 0.26 eV, and more preferably, 0.01 eV or more and less than 0.20.

In a case where the layer containing the organic material and the inorganic material has the absorption peak in the visible light region, N,N'-bis(3-methylphenyl)-N,N'-diphenyl-[1,1'-biphenyl]-4,4'-diamine (abbreviation: TPD); 4,4'-bis[N-(1-naphthyl)-N-phenylamino]biphenyl (abbreviation: α-NPD); N,N'-bis(spiro-9,9'-bifluorene-2-yl)-N,N'-diphenylbenzidine (abbreviation: BSPB); 4,4'-bis[N-(9,9-dimethylfluorene-2-yl)-N-phenylamino]biphenyl (abbreviation: DFLDPBi); 4,4'-bis[N-(4-biphenylyl)-N-phenylamino]biphenyl (abbreviation: BBPB) and the like can be given as the organic material.

In the above structure, the inorganic material is metal oxide. Specifically, one or more kinds of molybdenum oxide, vanadium oxide, ruthenium oxide, and tungsten oxide can be used as the inorganic material.

In the above structure, the layer containing the organic material and the inorganic material is provided to be in contact with one of the pair of electrodes.

In addition, the present invention includes a light emitting device having the above described light emitting element. Further, a light emitting device throughout the present specification includes an image display device, a luminescence device, and a light source (including a lighting device). Also, the light emitting device includes a module in which a panel is attached with a connector such as an FPC (flexible printed circuit), a TAB (tape automated bonding) tape and a TCP (tape carrier package); a module in which a printed wiring board is provided on the tip of a TAB tape or a TCP; and a module in which an IC (integrated circuit) is directly mounted on a light emitting element by the COG (chip on glass) technique.

Providing a layer having low activation energy of electrical conductivity in a light emitting element of the present invention makes it possible to suppress increase in driving voltage. Moreover, a light emitting element having longer lifetime can be provided.

Since the increase in driving voltage can be suppressed in the layer having the low activation energy even if the thickness of the layer is increased, the short-circuiting between upper and lower electrodes can be prevented by increasing the thickness of the layer having the low activation energy. Consequently, reduction in yield due to dust generated in a manufacturing process can be suppressed.

DESCRIPTION OF THE PREFERRED EMBODIMENTS

The embodiment modes in accordance with the present invention will hereinafter be described in detail with reference to the drawings. It is easily understood by those skilled in the art that the embodiment modes and details herein disclosed can be modified in various ways without departing from the purpose and the scope of the present invention. The present invention should not be interpreted as being limited to the description of the embodiment modes to be given below.

Embodiment Mode 1

A light emitting element of the present invention includes a plurality of layers between a pair of electrodes. The plurality of layers are laminated by combining layers made from a substance having a strong carrier injecting property and a substance having a strong carrier transporting property such that a light emitting region is formed away from the electrodes, or, carriers (supports) are recombined at a portion away from the electrodes.

Figure 1A:
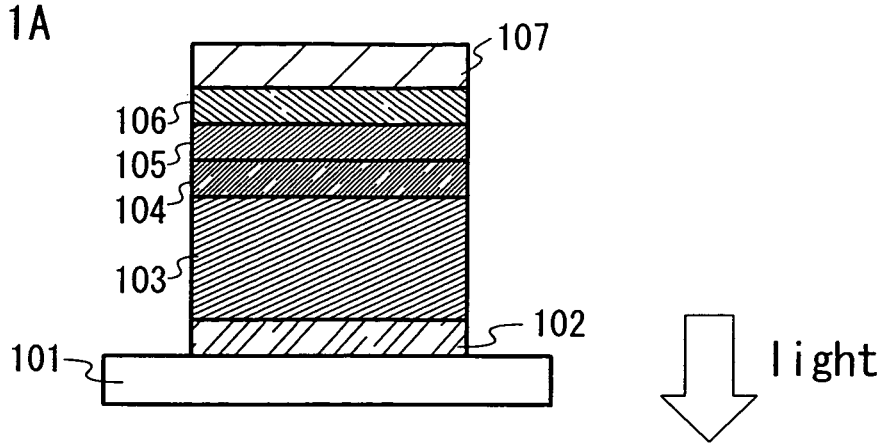
FIGS. 1A to 1C are cross sectional views explaining light emitting elements of the present invention.

One mode of the light emitting element of the present invention will be described with reference to FIG. 1A.

In this embodiment mode, the light emitting element includes a first electrode 102, a laminated body formed by laminating a first layer 103, a second layer 104, a third layer 105 and a fourth layer 106, over the first electrode 102 in this order, and a second electrode 107 provided on the fourth layer 106. In this embodiment mode, the first electrode 102 serves as an anode and the second electrode 107 serves as a cathode.

A substrate 101 is used as a supporting body of the light emitting element. As the substrate 101, for example, glass, plastic, or the like can be used. Further, in addition to glass and plastic, other material can be used as the substrate 101 so long as it serves as a supporting body.

As the first electrode 102, various kinds of metal, alloys, electrical conductive compounds, and the like, can be used. For example, indium tin oxide (ITO), indium tin oxide containing silicon or silicon oxide, indium zinc oxide (IZO), indium tin oxide containing tungsten oxide and zinc oxide (IWZO), and the like can be given. These conductive metal oxide films are generally formed by sputtering. For example, indium zinc oxide (IZO) can be formed by sputtering using a target in which 1 to 20 wt % zinc oxide is mixed in indium oxide. Also, indium tin oxide containing tungsten oxide and zinc oxide (IWZO) can be formed by sputtering using a target in which 0.5 to 5 wt % tungsten oxide and 0.1 to 1 wt % zinc oxide are added to indium oxide. In addition, gold (Au), platinum (Pt), nickel (Ni), tungsten (W), chromium (Cr), molybdenum (Mo), iron (Fe), cobalt (Co), titanium (Ti), copper (Cu), palladium (Pd), aluminum (Al), aluminum-silicon (Al—Si), aluminum-titanium (Al—Ti), aluminum-silicon-copper (Al—Si—Cu), nitride of a metal material (TiN), and the like can be used for the first electrode 102. When the first electrode is used as the anode, the first electrode is preferably formed using a material having a high work function (4.0 eV or more) among the above mentioned materials.

In the light emitting element of the present invention, a material of the first electrode 102 is not limited to a material having a high work function, and a material having a low work function can also be used.

The first layer 103 contains both an organic material and an inorganic material, and whose activation energy of electrical conductivity is 0.01 eV or more and less than 0.30 eV. Preferably, the first layer 103 is a layer whose activation energy is 0.01 eV or more and less than 0.26 eV. More preferably, the first layer 103 is a layer whose activation energy is 0.01 eV or more and less than 0.20 eV. In the present specification, such the layer is hereinafter referred to as a layer having low activation energy of electrical conductivity.

Since the light emitting element of the present invention has a layer having low activation energy of electrical conductivity, the light emitting element has a high carrier density so as to make ohmic contact to the electrodes, thereby reducing the driving voltage of the light emitting element. In addition, since the light emitting element of the present invention has the high carrier density, the light emitting element also has an excellent carrier transporting property. Further, in order to obtain a sufficient carrier density, the activation energy of electrical conductivity is preferably 0.01 eV or more and less than 0.30 eV. It is more preferable that the activation energy of electrical conductivity be 0.01 eV or more and less than 0.26 eV. Since a current-voltage characteristic is not changed even at a high voltage side, a layer whose activation energy of electrical conductivity is 0.01 eV or more and less than 0.20 eV, is preferably used for the light emitting element.

As an inorganic material contained in the first layer 103 having low activation energy of electrical conductivity, metal oxide is preferably used. Specifically, molybdenum oxide (MoOx), vanadium oxide (VOx), ruthenium oxide (RuOx), tungsten oxide (WOx), and the like can be given as the inorganic materials. In addition, indium tin oxide (ITO) or zinc oxide (ZnO) can be used. Further, the inorganic material is not limited to the above mentioned materials, and other substance may be used. As an organic material included in the first layer 103, an organic material having an arylamine skeleton is preferably used. For example, an aromatic amine (i.e., including a benzene ring-nitrogen bond) compound such as: 4,4'-bis(N-{4-[N,N'-bis(3-methylphenyl)amino]phenyl}-N-phenylamino) biphenyl (abbreviation: DNTPD); 4,4'-bis[N-(4-diphenylaminophenyl)-N-phenylamino]biphenyl (abbreviation: DPAB); N,N'-bis(3-methylphenyl)-N,N'-diphenyl-[1,1'-biphenyl]-4,4'-diamine (abbreviation: TPD); 4,4'-bis[N-(1-naphthyl)-N-phenylamino]biphenyl (abbreviation: α-NPD); N,N'-bis(spiro-9,9'-bifluorene-2-yl)-N,N'-diphenylbenzidine (abbreviation: BSPB); 4,4'-bis[N-(9,9-dimethylfluorene-2-yl)-N-phenylamino]biphenyl (abbreviation: DFLDPBi); 4,4'-bis[N-(4-biphenylyl)-N-phenylamino]biphenyl (abbreviation: BBPB); 1,5-bis(diphenylamino) naphthalene (abbreviation: DPAN); 4,4',4''-tris(N,N-diphenylamino) triphenylamine (abbreviation: TDATA); and 4,4',4''-tris[N-(3-methylphenyl)-N-phenylamino]triphenylamine (abbreviation: MTDATA), can be used. Further, other substance may be used so long as it is a substance of which a hole transporting property is stronger than an electron transporting property.

Furthermore, the first layer 103 may include a structure formed by laminating two or more layers, instead of the above described single layer structure.

The second layer 104 is formed using a substance having a strong hole transporting property, e.g., an aromatic amine (i.e., including a benzene ring-nitrogen bond) compound such as α-NPD, TPD, TDATA, MTDATA, and BSPB. These substances mentioned here are mainly substances having hole mobility of $10^{-6}$ cm$^2$/Vs or more. Further, in addition to the above mentioned substances, other substance can be used so long as it is a substance of which a hole transporting property is stronger than an electron transporting property. Moreover, the second layer 104 may includes two or more layers made from the above mentioned substances, instead of a single layer.

The third layer 105 is a layer containing a substance having a strong light emitting property. For example, the third layer 105 is formed by freely combining a substance having a strong light emitting property such as N,N'-dimethylquinacridone (abbreviation: DMQd) and 3-(2-benzothiazoyl)-7-diethylamino coumarin (abbreviation: coumarin 6) and a substance having a strong carrier transporting property and a good film property when it is formed as a film (that is, which is difficult to be crystallized) such as tris(8-quinolinolato) aluminum (abbreviation: Alq$_3$) and 9,10-di (2-naphthyl) anthracene (abbreviation: DNA). Further, since Alq$_3$ and DNA are substances which also have strong light emitting properties, each of which may be independently used as the third layer 105.

The fourth layer 106 is formed using a substance having a strong electron transporting property, e.g., a metal complex having a quinoline skeleton or a benzoquinoline skeleton such as tris(8-quinolinolato) aluminum (abbreviation: Alq$_3$), tris(5-methyl-8-quinolinolato) aluminum (abbreviation: Almq$_3$), bis(10-hydroxybenzo[h]-quinolinato) beryllium (abbreviation: BeBq$_2$), and bis(2-methyl-8-quinolinolato)-4-phenylphenolato-aluminum (abbreviation: BAlq), or the like. In addition, a metal complex having oxazole ligand or thiazole ligand such as bis[2-(2-hydroxyphenyl)-benzoxazolato]zinc (abbreviation: Zn(BOX)$_2$) and bis[2-(2-hydroxyphenyl)-benzothiazolato]zinc (abbreviation: Zn(BTZ)$_2$) can be used. In addition to the metal complexes, 2-(4-biphenylyl)-5-(4-tert-butylphenyl)-1,3,4-oxadiazole (abbreviation: PBD); 1,3-bis[5-p-tert-butylphenyl)-1,3,4-oxadiazole-2-yl] benzene (abbreviation: OXD-7); 3-(4-tert-butylphenyl)-4-phenyl-5-(4-biphenylyl)-1,2,4-triazole (abbreviation: TAZ); 3-(4-tert-butylphenyl)-4-(4-ethylphenyl)-5-(4-biphenylyl)-1,2,4-triazole (abbreviation: p-EtTAZ); bathophenanthroline (abbreviation: BPhen); bathocuproin (abbreviation: BCP); and the like can be used. The substances mentioned here are mainly substances having electron mobility of $10^{-6}$ cm$^2$/Vs or more. Further, a substance other than the above mentioned substances may be used for the fourth layer 106 so long as it is a substance of which an electron transporting property is stronger than a hole transporting property. Furthermore, the fourth layer 106 may include two or more layers formed using the above mentioned substances, instead of a single layer.

As a substance for forming the second electrode 107, metal, an alloy, an electroconductive compound each having a low work function (3.8 eV or less), or a mixture thereof can be used. Specifically, an element belonging to group 1 or group 2 of the periodic table, that is, alkali metal such as lithium (Li) and cesium (Cs), alkali earth metal such as magnesium (Mg), calcium (Ca), and strontium (Sr), and an alloy containing these elements (Mg:Ag, Al:Li) can be given as a cathode material. Alternatively, by interposing a layer promoting injection of electrons between the second electrode 107 and a light emitting layer, various kinds of conductive materials such as Al, Ag, ITO, and indium tin oxide containing silicon can be used for the second electrode 107, regardless of the amount of a work function.

As the layer having a function of promoting injection of electrons, a compound of alkali metal or alkali earth metal, such as lithium fluoride (LiF), cesium fluoride (CsF) and calcium fluoride ($CaF_2$), can be used. In addition, a layer made from a substance having an electron transporting property, which contains alkali metal or alkali earth metal, for example, $Alq_3$ containing magnesium (Mg), or the like can be used.

The first layer 103, the second layer 104, the third layer 105 and the fourth layer 106 may be formed by an evaporation method. For example, these layers may be formed by using ink-jet, spin coating, or the like, in addition to the evaporation method. Further, they may be formed by using different methods for each electrode or each layer.

In the light emitting element having the above described structure, when current flows through the light emitting element due to difference in potential caused between the first electrode 102 and the second electrode 107, holes and electrons are recombined at the third layer 105, which contains a substance having a strong light emitting property, and thus light is emitted. That is, a light emitting region is formed in the third layer 105. Further, the entire third layer 105 is not necessary to serve as the light emitting region. For example, the light emitting region may be formed only in a part of the third layer 105 at the second layer 104 side or the fourth layer 106 side.

Figure 1B:
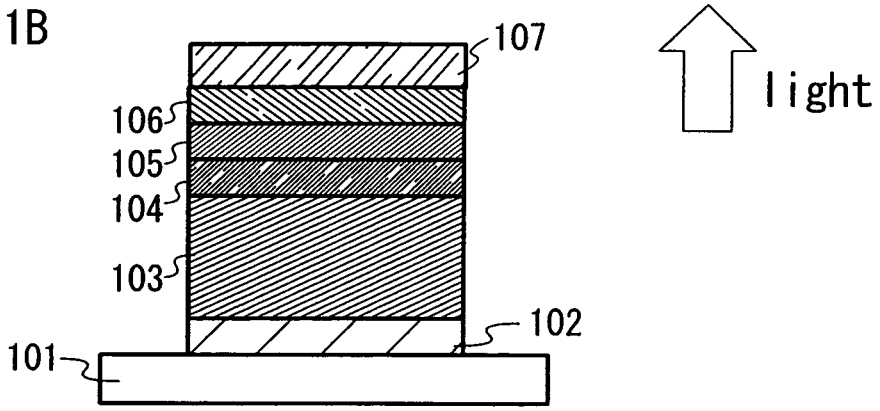
Figure 1C:
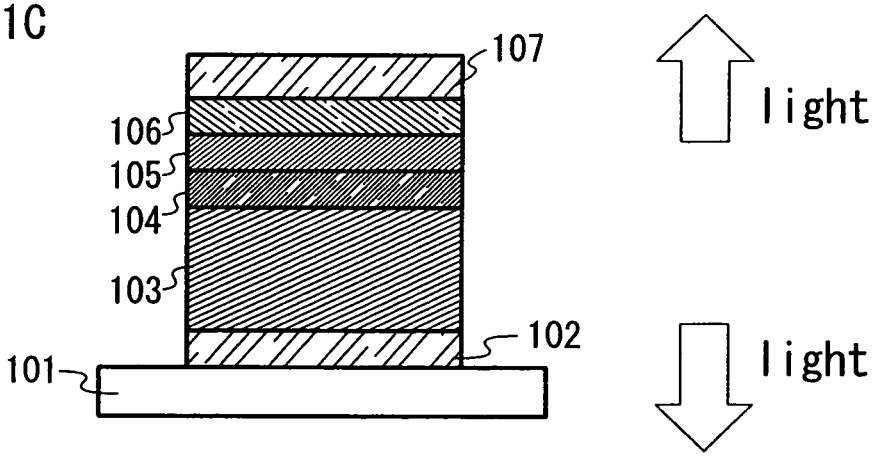

Light generated in the light emitting region is emitted to an external portion through one or both of the first electrode 102 and the second electrode 107. Therefore, one or both of the first electrode 102 and the second electrode 107 is/are formed using a substance having a light transmitting property. When only the first electrode 102 is formed using a substance having a light transmitting property, light generated in the light emitting region is emitted through the first electrode 102 and the substrate, as shown in FIG. 1A. On the other hand, when only the second electrode 107 is formed using a substance having a light transmitting property, light generated in the light emitting region is emitted through the second electrode 107 from the opposite side of the substrate, as shown in FIG. 1B. When the first electrode 102 and the second electrode 107 are both formed using a substance having a light transmitting property, light generated in the light emitting region is emitted through both the first electrode 102 and the second electrode 107 from the substrate side and the opposite side of the substrate, as shown in FIG. 1C.

Further, a structure of layers provided between the first electrode 102 and the second electrode 107 is not limited to the above described structure. A structure different from the above described structure may be employed so long as it has a region where holes and electrons are recombined at a portion away from the first electrode 102 and the second electrode 107 so as to prevent optical quenching caused due to proximity of the light emitting region and metal, and also has a layer having low activation energy of electrical conductivity. That is, a laminated structure of layers provided between the first and second electrodes, is not particularly limited, and layers formed using a substance having a strong electron transporting property or a strong hole transporting property, a substance having a strong electron injecting property, a substance having a strong hole injecting property, a substance having a bipolar property (i.e., a substance having both a strong electron transporting property and a strong hole transporting property), and the like, may be freely provided in combination with a layer having low activation energy of electrical conductivity. Moreover, a layer formed using a silicon oxide film and the like may be provided over the first electrode 102 to control a position of carrier recombination.

Figure 2:
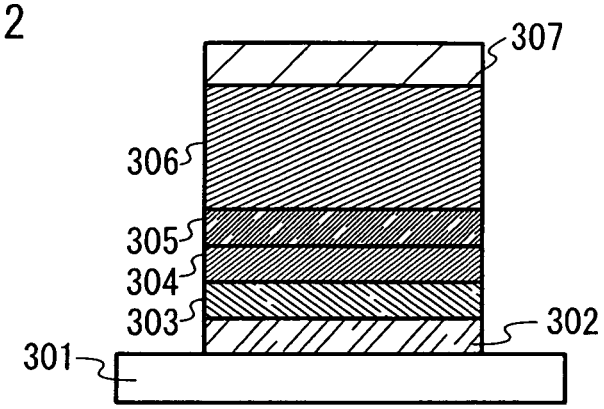
FIG. 2 is a cross sectional view explaining a light emitting element of the present invention.

The light emitting element shown in FIG. 2 is formed by sequentially laminating a first layer 303 formed using a substance having a strong electron transporting property, a second layer 304 containing a substance having a strong light emitting property, a third layer 305 formed using a substance having a strong hole transporting property, a fourth layer 306 having low activation energy of electrical conductivity, and a second electrode 307 serving as an anode, over a first electrode 302 serving as a cathode. Further, reference numeral 301 is a substrate.

In this embodiment mode, a light emitting element is manufactured over a substrate made from glass, plastic or the like. By providing a plurality of light emitting elements like this light emitting element, over one substrate, a passive light emitting device can be manufactured. Further, a light emitting element may be manufactured over, for example, a thin film transistor (TFT) array substrate, instead of the substrate made from glass, plastic, or the like. This allows to manufacture an active matrix light emitting device which controls drive of a light emitting element by a TFT. Further, a structure of a TFT is not particularly limited, and either a staggered TFT or a inversely staggered TFT may be used. With respect to a driving circuit formed over the TFT array substrate, the driving circuit may be formed using an N-type TFT and a P-type TFT, or either an N-type TFT or a P-type TFT.

Reduction in driving voltage of the light emitting element of the present invention, can be realized by providing a layer having low activation energy of electrical conductivity, in the light emitting element. That is, since the layer having the low activation energy of electrical conductivity, has high carrier density, it can make ohmic contact to an electrode. Accordingly, the driving voltage of the light emitting element can be reduced. Further, since the layer has the high carrier density, the layer also has an excellent carrier transporting property. To obtain sufficient carrier density, the activation energy of electrical conductivity is preferably 0.01 eV or more and less than 0.30 eV. More preferably, the activation energy of electrical conductivity is 0.01 eV or more and less than 0.26 eV. Furthermore, a layer whose activation energy of electrical conductivity is 0.01 eV or more and less than 0.20 eV, is preferably used for a light emitting element since a current-voltage characteristic of the light emitting element, is not varied.

Moreover, since the layer having the low activation energy of electrical conductivity, has high carrier density, the increase in driving voltage can be suppressed even when the thickness of the layer is increased. Therefore, by increasing the thickness of the layer having the low activation energy of electrical conductivity, short-circuiting between upper and lower electrodes can be inhibited. Consequently, defects due to dust generated in a manufacturing process can be prevented, making it possible to improve the yield.

Increasing the thickness of the layer having the low activation energy of electrical conductivity, can prevent short-circuiting caused by damage and the like, and hence, a light emitting element with high reliability can be obtained. For example, as compared to a conventional light emitting element, in which a thickness between electrodes is 100 to 150 nm, a thickness of a light emitting element using a layer having low activation energy of electrical conductivity, between electrodes can be set to be 100 to 500 nm, and more preferably, 200 to 500 nm.

Since a layer having low activation energy of electrical conductivity used in a light emitting element of the present invention, has a high carrier density, the layer can make ohmic contact to electrodes. That is, contact resistance of the light emitting element with respect to the electrodes, is low. Therefore, a material for the electrodes can be freely selected regardless of a work function and the like. As a consequence, material choices for an electrode can be widened.

Since a layer having low activation energy of electrical conductivity of the present invention, can be formed by vacuum evaporation, when a layer containing a light emitting substance is formed by vacuum evaporation, the layer having low activation energy of electrical conductivity and the layer containing the light emitting substance can both be formed in one vacuum apparatus without exposing to atmospheric air. That is, these layers can be formed in vacuum. Thus, dust can be prevented from attaching to the layers in a manufacturing process, making it possible to increase the yield.

Furthermore, since a layer having low activation energy of electrical conductivity of the present invention contains both an organic material and an inorganic material, stress caused between electrodes and a layer containing a light emitting substance can be reduced.

Embodiment Mode 2

In this embodiment mode, a layer having low activation energy of electrical conductivity shown in Embodiment Mode 1 (i.e., a layer containing both an organic material and an inorganic material, and whose activation energy of electrical conductivity is 0.01 eV or more and less than 0.30 eV, preferably, 0.01 eV or more and less than 0.26 eV, and more preferably, 0.01 eV or more and less than 0.20 eV) will be described in more detail.

Figure 11:
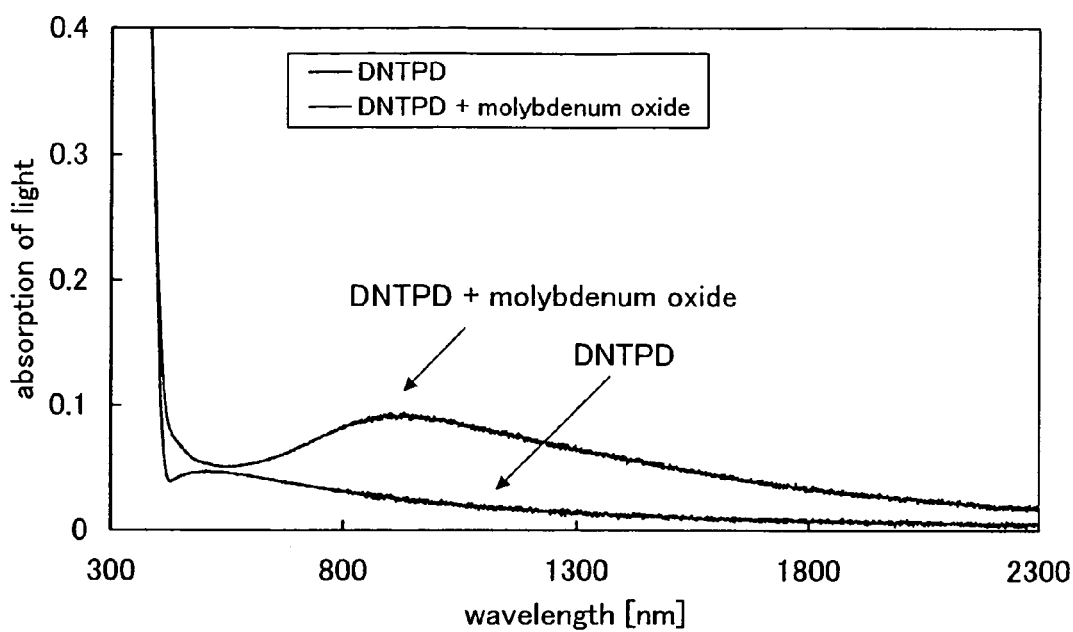
FIG. 11 is a graph showing an absorption spectrum of a layer containing DNTPD and molybdenum oxide.

A case where a layer containing both an organic material and an inorganic material, does not have an absorption peak in a visible light region, will be described in this embodiment mode. Specifically, a layer containing DNTPD and molybdenum oxide, which does not have an absorption peak in a visible light region, will be described in this embodiment mode. FIG. 11 shows an absorption spectrum of a layer containing DNTPD and molybdenum oxide, which is formed by co-evaporation such that a weight ratio between DNTPD and molybdenum oxide is 1:1. As shown in FIG. 11, it is known that the layer containing DNTPD and molybdenum oxide does not have an absorption peak in the visible light region. In addition to DNTPD, a layer containing an organic material such as DPAB and molybdenum oxide does not have an absorption peak in the visible light region.

An ITO film was formed on a first glass substrate to have a thickness of 110 nm to form an anode having an area of 4 mm². The first glass substrate having the anode made from ITO was washed with water and then dried. Thereafter, the first glass substrate was set in an evaporation apparatus, and an vacuum chamber was evacuated to the pressure of $1 \times 10^{-3}$ Pa or less.

Next, a film was formed by co-evaporation of DNTPD, which is an organic material, and molybdenum oxide, which is an inorganic material. The co-evaporation condition was adjusted such that the concentration of molybdenum oxide satisfied each condition of Table 1. Further, the film containing DNTPD and molybdenum oxide was formed to have a thickness of 200 nm. Note that the element 1 shown in Table 1 is formed using only DNTPD by evaporation to have a thickness of 200 nm.

TABLE 1

| | Concentration of molybdenum oxide |
|---|---|
| Element 1 | 0 wt % |
| Element 2 | 11 wt % |
| Element 3 | 20 wt % |
| Element 4 | 33 wt % |
| Element 5 | 50 wt % |
| Element 6 | 67 wt % |
| Element 7 | 80 wt % |
| Element 8 | 91 wt % |
| Element 9 | 94 wt % |

Thereafter, a cathode was formed using Al by evaporation to have a thickness of 200 nm. Under an $N_2$ atmosphere, a second glass substrate pasted with a drying agent was attached to the first glass substrate. Thus, elements 1 to 9 were obtained.

Figure 13:
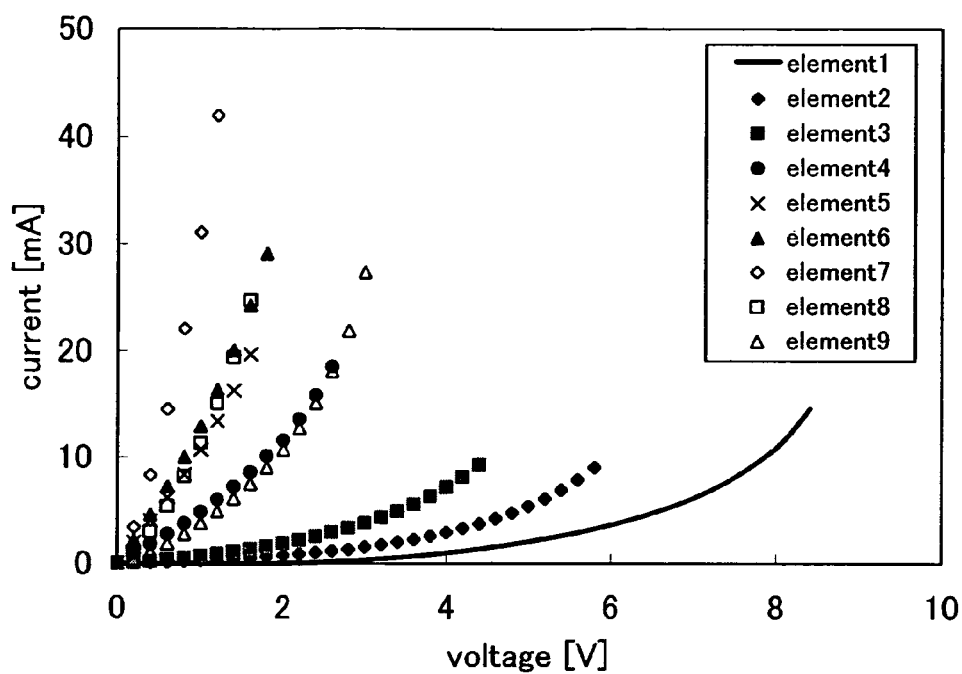
FIG. 13 is a graph showing a current-voltage characteristic of a layer containing DNTPD and molybdenum oxide.

Current-voltage characteristics of these elements 1 to 9 at 25° C. are shown in FIG. 13. It is known that the resistance of the elements 2 to 9 which contain molybdenum oxide is lower than that of the element 1, which contains no molybdenum oxide. It is also known that the more the concentration of molybdenum oxide increases, the more the resistance is reduced, whereas when the concentration of molybdenum oxide is more than 80 wt %, the more the resistance increases.

Figure 14:
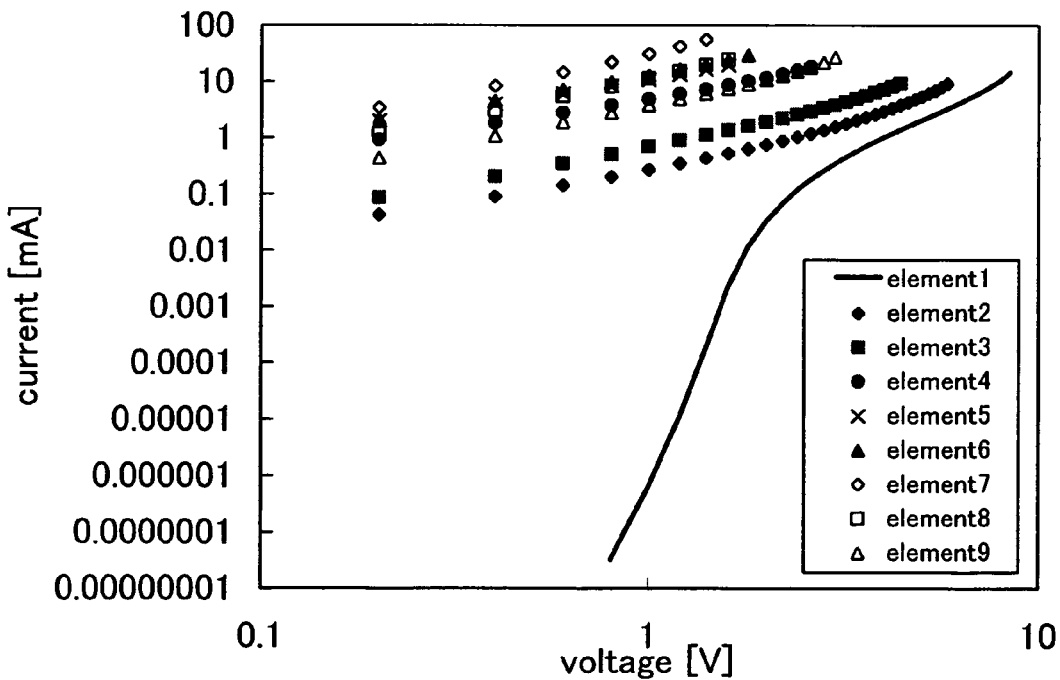
FIG. 14 is a graph showing logarithmic plot of a current-voltage characteristic of a layer containing DNTPD and molybdenum oxide.

Next, a graph of logarithm plot of current-voltage characteristics is shown in FIG. 14. It is known that the current-voltage characteristics of the elements 2 to 9 at a low voltage region are proportional to the first power to the second power of the voltage. Meanwhile, it is known that the current-voltage characteristic of the element 1 is proportional to the larger power of the voltage than the second power. This is because the element 1 makes Schottky contact to the anode made from ITO while the elements 2 to 9 make ohmic contact to the anodes made from ITO, respectively. Therefore, it can be thought that ohmic current dominates in the elements 2 to 9.

When ohmic current flows through the elements 2 to 9 at the low voltage region, and the layers containing DNTPD and molybdenum oxide are semiconductive, this is expressed by an Arrhenius equation as follows.

$$R = V/I = A \times \exp(Ea/kT) \qquad \text{[Equation 1]}$$

R: resistance
V: voltage
I: current
A: constant
Ea: activation energy
k: Boltzmann constant
T: absolute temperature Equation 1 can reads to the following equation in the case of certain constant voltage.

$$\ln(I) = -(Ea/k) \times (1/T) + B \qquad \text{[Equation 2]}$$

Thus, in accordance with the Arrhenius plot of ln (I) and 1/T, activation energy can be obtained.

Figure 15:
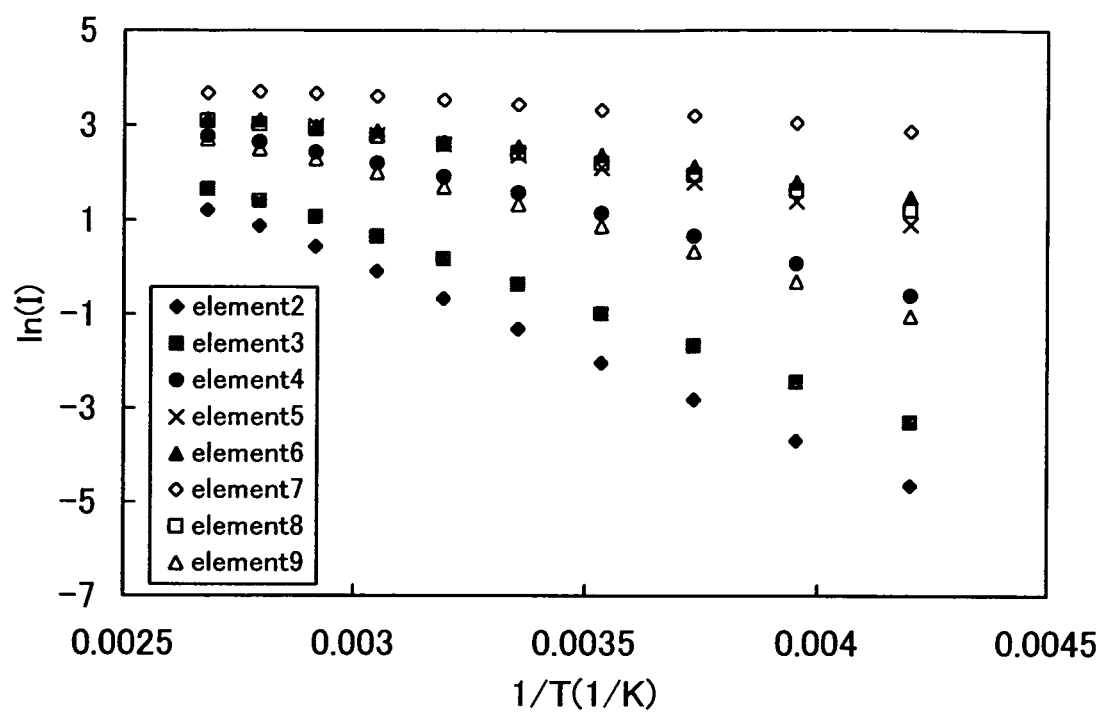
FIG. 15 is a graph showing Arrhenius plot of a layer containing DNTPD and molybdenum oxide in a case of 1 V.
Figure 16:
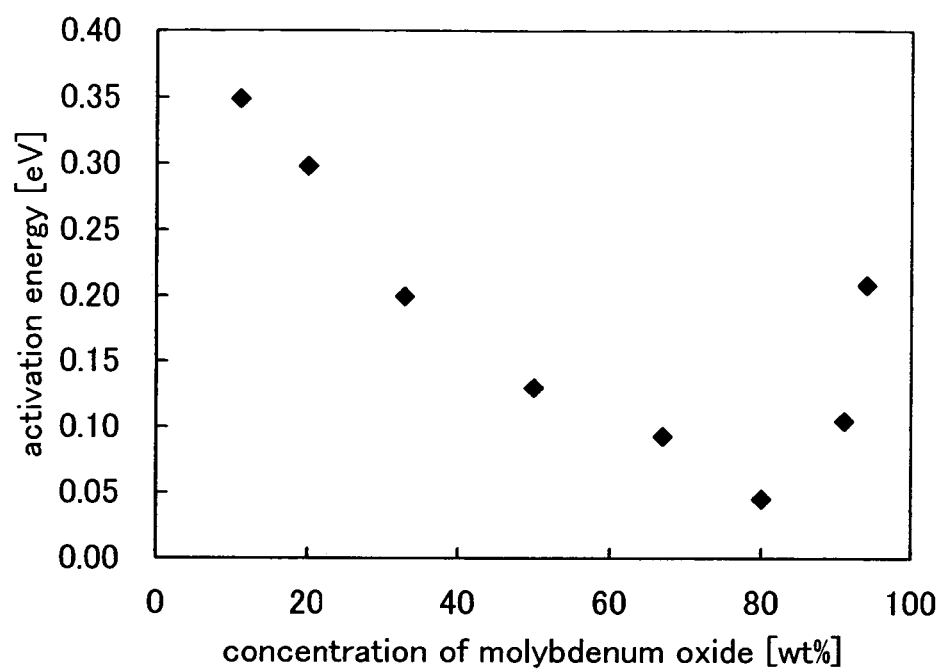
FIG. 16 is a graph showing activation energy of a layer containing DNTPD and molybdenum oxide.

Arrhenius plot of the elements 2 to 9 at 1V is shown in FIG. 15. It is known that plot of each element is almost on a straight line. Activation energy is obtained in accordance with the slope of the straight line, and change in activation energy with respect to the concentration of molybdenum oxide is shown in FIG. 16. It is known that the curve of FIG. 16 has a concave shape. Further, in the case of an element in which only molybdenum oxide was formed by evaporation on an anode made from ITO to have a thickness of 50 nm and a cathode was formed using Al (hereinafter, this element is referred to as an element 10), when the element 10 was subjected to the same analysis described above, it was found that activation energy was 0.26 eV. The activation energy of the element 2 is larger than that of the element 10. It is thought that this is because the concentration of molybdenum oxide of the element 2 is too low. On the other hand, the activation energy of the elements 3 to 9 is lower than the activation energy of the element 10. Thus, by containing a certain amount of molybdenum oxide, activation energy, which cannot be obtained in a single film of molybdenum oxide, can be obtained.

Further, when using a layer which does not have an absorption peak in the visible region shown in this embodiment mode, for a light emitting element, it is preferable to use a layer of which the activation energy becomes 0.01 eV or more and less than 0.30 eV, preferably 0.01 eV or more and less than 0.26 eV, more preferably 0.01 eV or more and less than 0.20 eV, and also it is preferable to use a layer of which a concentration of molybdenum oxide is 30 wt % or more and 95 wt % or less.

Embodiment Mode 3

Figure 12:
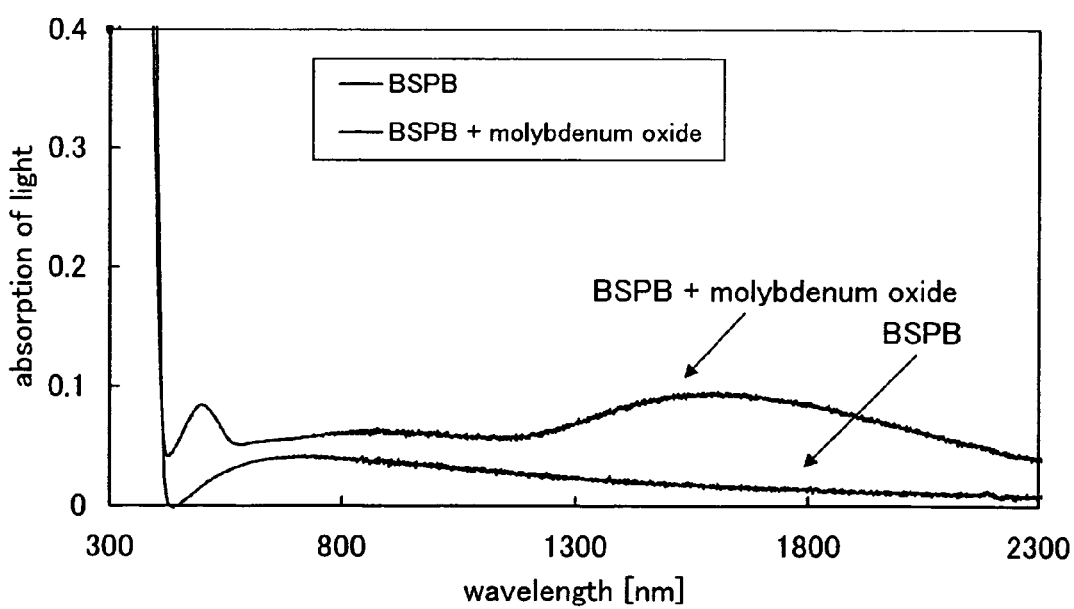
FIG. 12 is a graph showing an absorption spectrum of a layer containing BSPB and molybdenum oxide.

A case where a layer containing both an organic material and an inorganic material has an absorption peak in a visible light region, which is different from Embodiment Mode 2, will be described in this embodiment mode. In this embodiment mode, a layer containing BSPB and molybdenum oxide, which has an absorption peak in the visible light region, will be described. FIG. 12 shows an absorption spectrum of a layer, which is formed by co-evaporation of BSPB and molybdenum oxide such that a weight ratio between BSPB and molybdenum oxide is 1:1. According to FIG. 12, it is known that the layer containing BSPB and molybdenum oxide has an absorption peak in the visible light region. In addition to BSPB, a layer containing an organic material such as TPD, α-NPD, DFLDPBi and BBPB, and molybdenum oxide has an absorption peak in the visible light region.

A film with a thickness of 110 nm was formed using ITO over a first glass substrate to form an anode having an area of 4 mm². The first glass substrate having the anode made from ITO was washed with water and then dried. Thereafter, the first glass substrate was set in an evaporation apparatus, and an vacuum chamber was evacuated to the pressure of $1 \times 10^{-3}$ Pa or less.

Next, a film was formed by co-evaporation of BSPB, which was an organic material, and molybdenum oxide, which was an inorganic material. The co-evaporation condition was adjusted such that the concentration of molybdenum oxide satisfied each condition of Table 2. Further, the film containing BSPB and molybdenum oxide was formed to have a thickness of 200 nm. Note that the element 11 is formed using only BSPB by evaporation to have a thickness of 200 nm.

TABLE 2

| | Concentration of molybdenum oxide |
|---|---|
| Element 11 | 0 wt % |
| Element 12 | 5 wt % |
| Element 13 | 20 wt % |
| Element 14 | 27 wt % |
| Element 15 | 43 wt % |

Thereafter, a cathode was formed using Al by evaporation to have a thickness of 200 nm. Under an $N_2$ atmosphere, a second glass substrate pasted with a drying agent was attached to the first glass substrate. Thus, elements 11 to 15 were obtained.

Figure 17:
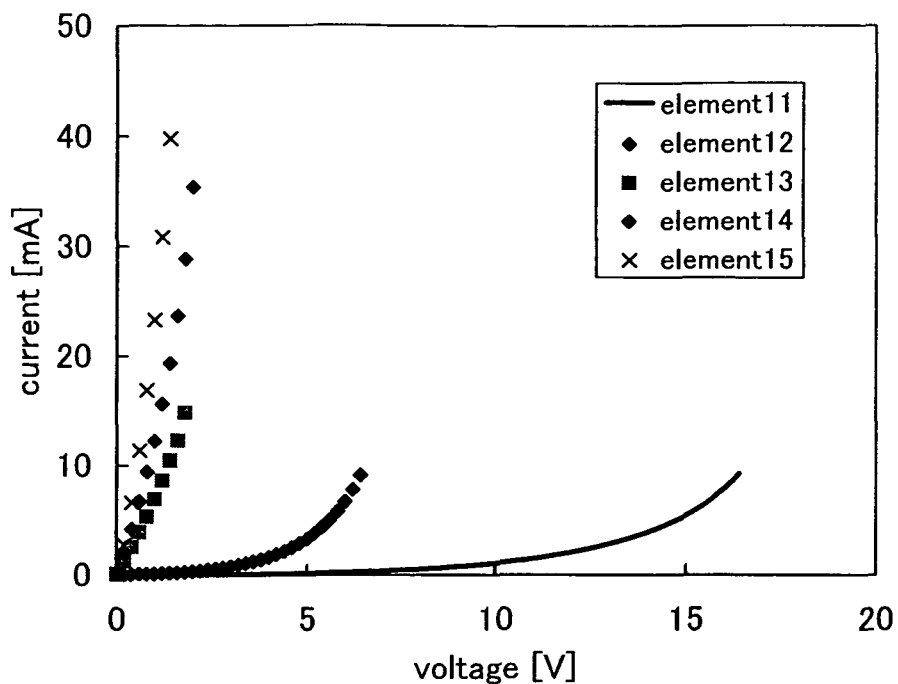
FIG. 17 is a graph showing a current-voltage characteristic of a layer containing BSPB and molybdenum oxide.

Current-voltage characteristics of the elements 11 to 15 at 25° C. are shown in FIG. 17. The resistance of the elements 12 to 15 which contain molybdenum oxide is lower than that of the element 11, which contains no molybdenum oxide.

Figure 18:
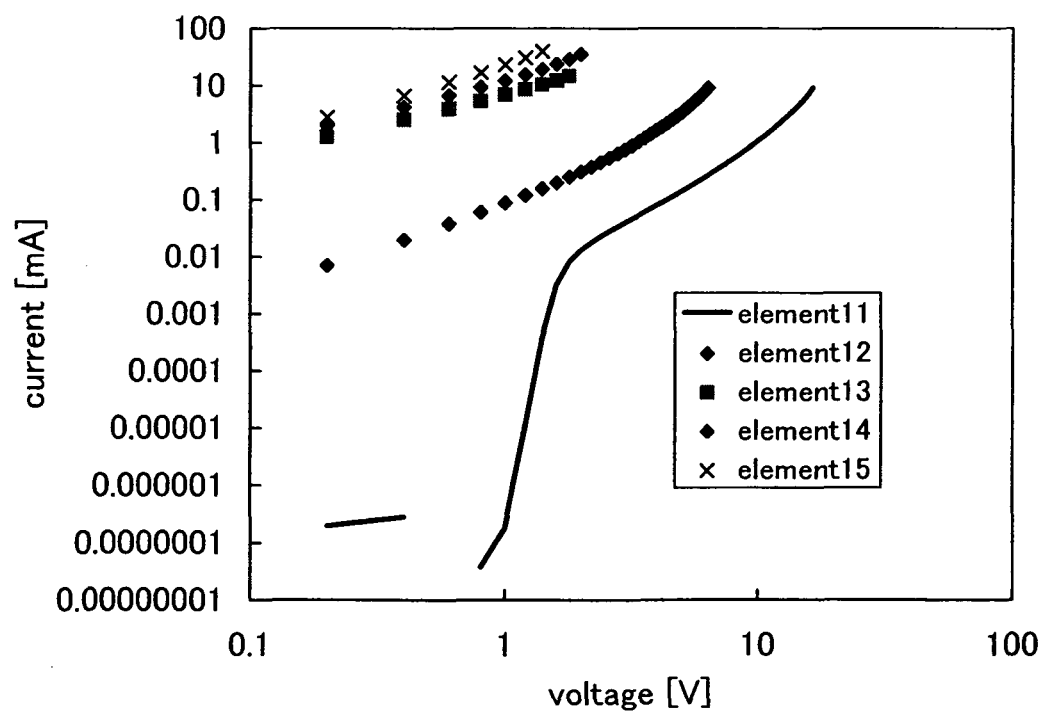
FIG. 18 is a graph showing logarithmic plot of a current-voltage characteristic of a layer containing BSPB and molybdenum oxide.

Next, a graph of logarithmic plot of current-voltage characteristics is shown in FIG. 18. It is known that the current-voltage characteristics of the elements 12 to 15 in a low voltage region are proportional to the first power to the second power of the voltage. Meanwhile, it is known that the current-voltage characteristic of the element 11 is proportional to the larger power of the voltage than the second power. This is because the element 11 makes Schottky contact to the anode made from ITO while the elements 12 to 15 make ohmic contact to the anodes made from ITO, respectively. Therefore, it is thought that ohmic current dominates in the elements 12 to 15.

Figure 19:
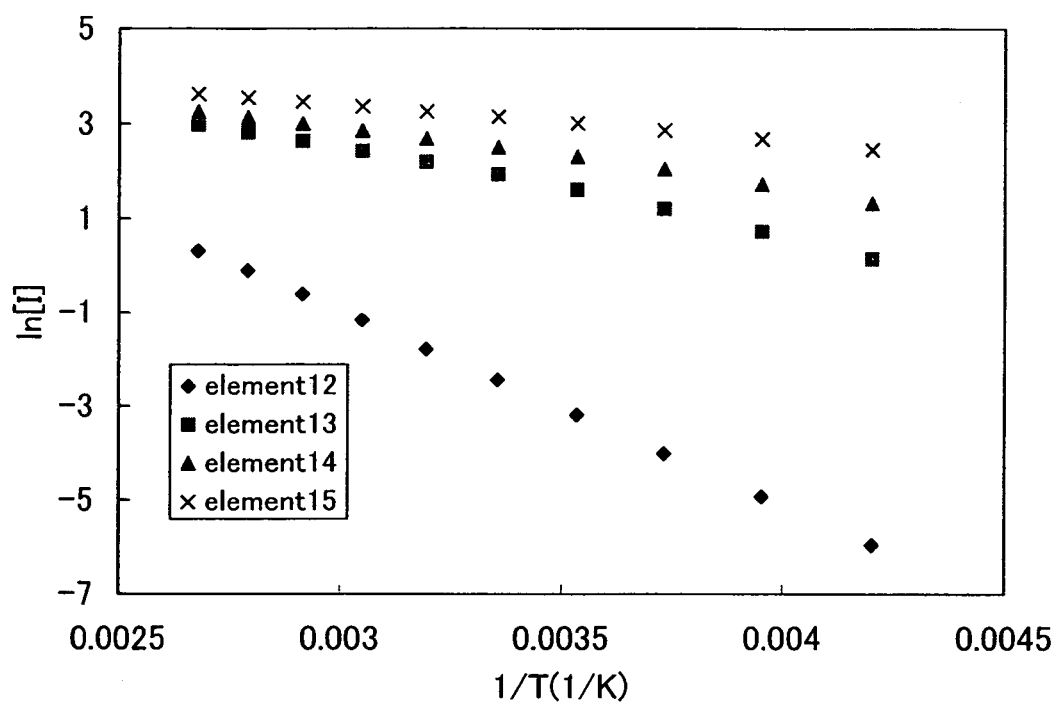
FIG. 19 is a graph showing Arrhenius plot of a layer containing BSPB and molybdenum oxide in a case of 1 V.
Figure 20:
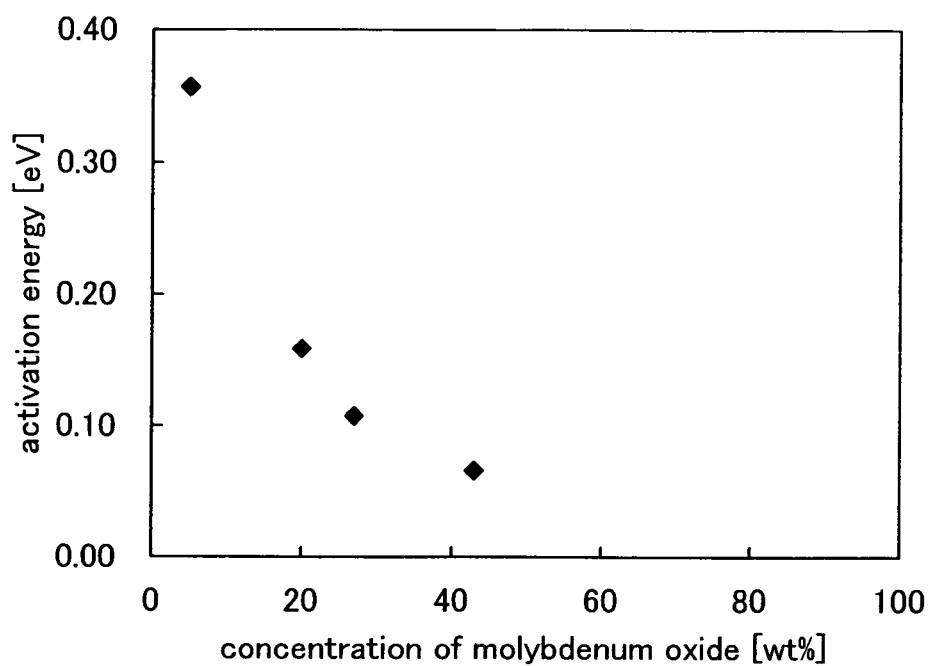
FIG. 20 is a graph showing activation energy of a layer containing BSPB and molybdenum oxide.

When ohmic current flows through the elements 12 to 15 at the low voltage region and the layers containing BSPB and molybdenum oxide are semiconductive, activation energy is obtained from Arrhenius plot in the same manner as Embodiment Mode 2. Arrhenius plot of the elements 12 to 15 at 1V is shown in FIG. 19. It is known that plot of each element is almost on a straight line. Activation energy is obtained in accordance with the slope of the straight line, and change in activation energy with respect to the concentration of molybdenum oxide is shown in FIG. 20. In view of the activation energy of 0.26 eV of the element 10, in which only molybdenum oxide was evaporated, it can be said that the curve shown in FIG. 20 has a convex shape. Further, the element 12 has larger activation energy than that of the element 10. It is thought that this is because the concentration of molybdenum oxide of the element 12 is too low. On the other hand, the activation energy of the elements 13 to 15 is lower than that of the element 10. Thus, by containing a certain amount of molybdenum oxide, activation energy, which cannot be obtained in a single film of molybdenum oxide, can be obtained.

Further, when using a layer which has an absorption peak in the visible region shown in this embodiment mode, for a light emitting element, it is preferable to use a layer of which the activation energy becomes 0.01 eV or more and less than 0.30 eV, preferably 0.01 eV or more and less than 0.26 eV, more preferably 0.01 eV or more and less than 0.20 eV, and also it is preferable to use a layer of which a concentration of molybdenum oxide is 5 wt % or more and 95 wt % or less.

Embodiment Mode 4

A light emitting element having a different structure from the light emitting elements shown in Embodiment Mode 1 will be described with reference to FIGS. 3A to 3C and FIGS. 4A to 4C.

Figure 3A:
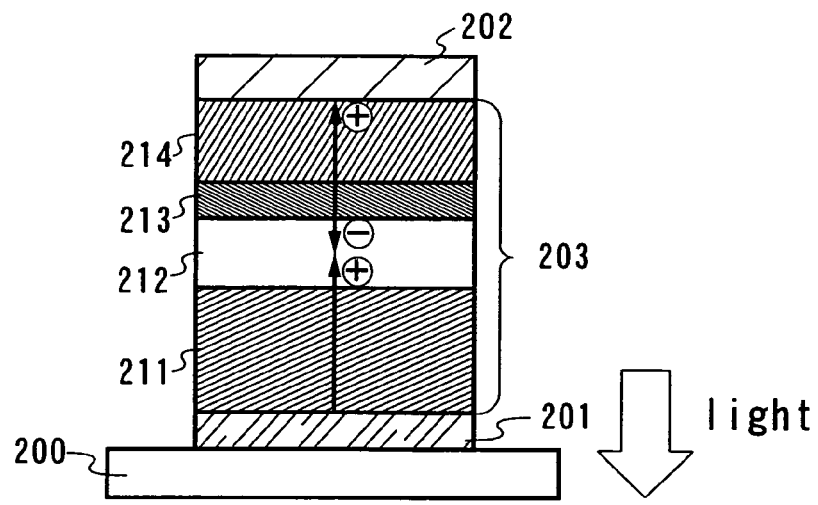
FIGS. 3A to 3C are cross sectional views explaining light emitting elements of the present invention.

FIG. 3A shows an example of a structure of a light emitting element of the present invention. The light emitting element has a structure in which a first layer 211, a second layer 212, a third layer 213, and a fourth layer 214 are laminated between a first electrode 201 and a second electrode 202. In this embodiment mode, the first electrode 201 serves as an anode and the second electrode 202 serves as a cathode.

The first electrode 201 and the second electrode 202 can employ the same structure as Embodiment Mode 1. The first layer 211 is a layer having low activation energy, which is described in Embodiment Mode 2 and Embodiment Mode 3. The second layer 212 is a layer containing a substance having a strong light emitting property. The third layer 213 is a layer containing one compound selected from metal oxide and a compound having a strong electron transporting property. The fourth layer 214 is a layer having low activation energy, which is described in Embodiment Mode 2 and Embodiment Mode 3. Metal oxide contained in the third layer 213 is preferably alkali metal oxide or alkali earth metal oxide. Specifically, lithium oxide, calcium oxide, barium oxide, and the like can be given.

In the above mentioned structure, as shown in FIG. 3A, by applying voltage to the light emitting element, electrons are transferred in the vicinity of an interface between the third layer 213 and the fourth layer 214 to generate electrons and holes. The third layer 213 transports electrons to the second layer 212 while the fourth layer 214 transports holes to the second electrode 202. That is, a combination of the third layer 213 and the fourth layer 214 serves as a carrier generating layer. Also, it can be said that the fourth layer 214 serves to transport holes to the second electrode 202. In addition, by laminating another second layer and another third layer between the fourth layer 214 and the second electrode 202, a tandem light emitting element can also be manufactured.

The first layer 211 and the fourth layer 214 exhibit extremely strong hole injecting or transporting properties. Therefore, in the light emitting element of the present embodiment mode, thicknesses of the layers located on both sides of the second layer having a function to emit light, can be increased, making it possible to prevent the short-circuiting of the light emitting element efficiently. In the case of the example shown in FIG. 3A, when the second electrode 202 is formed by sputtering, damage to the second layer 212 in which a substance having a light emitting property exists, can be reduced. Moreover, by forming the first layer 211 and the fourth layer 214 using the same material, an effect of inhibiting stress distortion can be expected since the layer located on the side of the first electrode in a layer 203 containing a light emitting substance and the layer located on the side of the second electrode in the layer 203 are formed using the same material.

The light emitting element of the present invention has different variations on its structure by changing the kinds of the first electrode 201 and the second electrode 202. Schematic views of the different variations are shown in FIGS. 3B and 3C and FIGS. 4A to 4C. Further, the same reference numerals used in FIG. 3A are also used in FIGS. 3B and 3C and FIGS. 4A to 4C. Reference numeral 200 represents a substrate for supporting a light emitting element of the present invention.

Figure 3B:
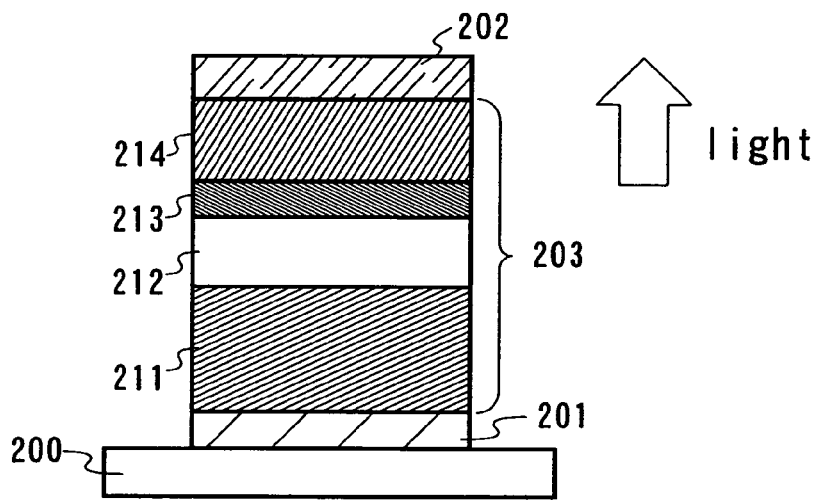
Figure 3C:
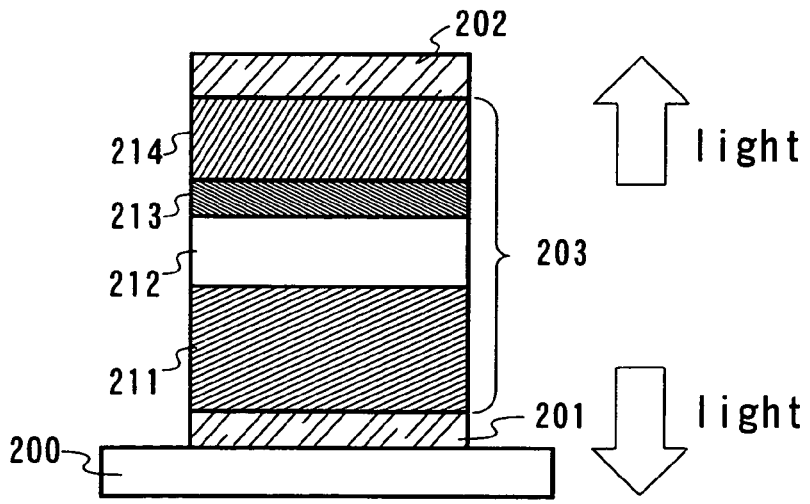

FIGS. 3A to 3C show examples in each of which the first layer 211, the second layer 212, the third layer 213 and the fourth layer 214 are laminated over the substrate 200 in this order. When the first electrode 201 has a light transmitting property and the second electrode 202 has a light shielding property (in particular, a light reflecting property), light can be emitted through the substrate 200 as shown in FIG. 3A. Alternatively, when the first electrode 201 has a light shielding property (in particular, a light reflecting property) and the second electrode 202 has a light transmitting property, light can be emitted through the opposite side of the substrate 200, as shown in FIG. 3B. Also, when the first electrode 201 and the second electrode 202 both have light transmitting properties, light can be emitted both through the substrate 200 and the opposite side of the substrate 200, as shown in FIG. 3C.

Figure 4A:
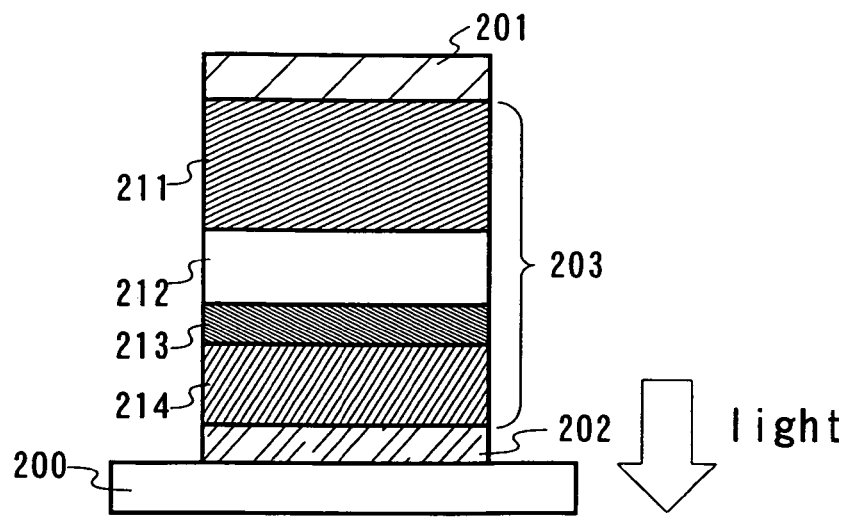
FIGS. 4A to 4C are cross sectional views explaining light emitting elements of the present invention.
Figure 4B:
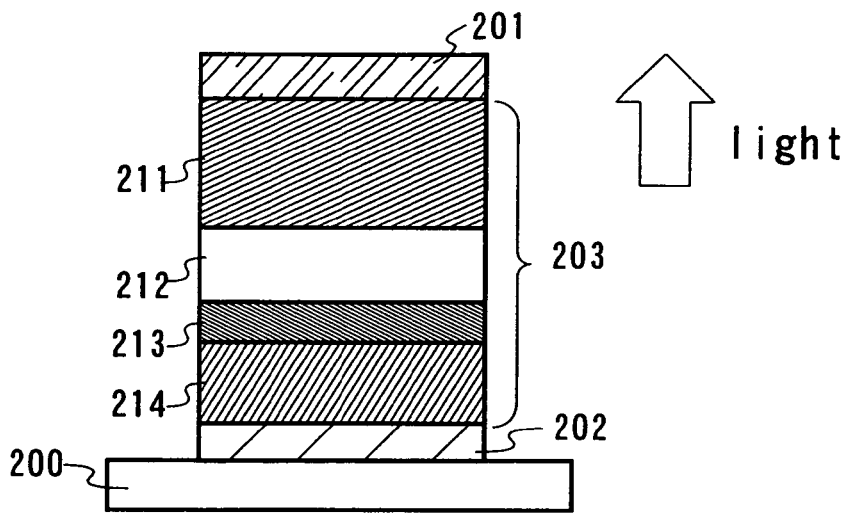
Figure 4C:
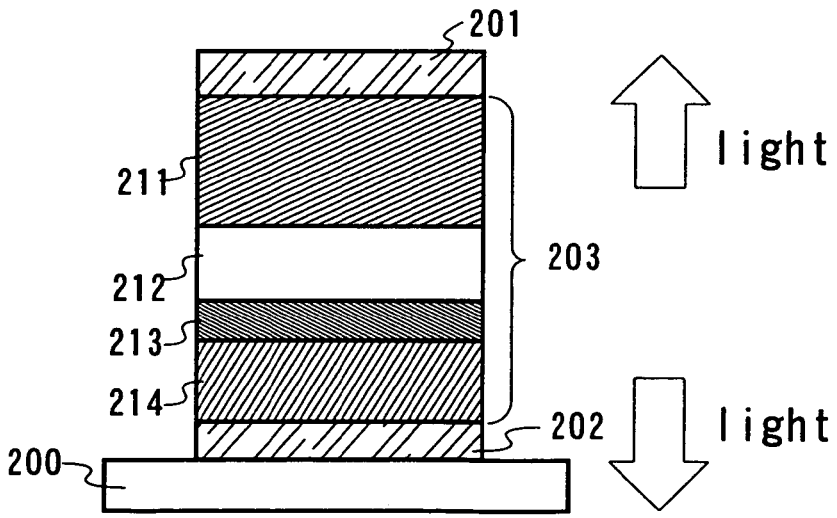

FIGS. 4A to 4C show examples in each of which the fourth layer 214, the third layer 213, the second layer 212, and the first layer 211 are laminated over the substrate 200 in this order. When the first electrode 201 has a light shielding property (in particular, a light reflecting property) and the second electrode 202 has a light transmitting property, light can be emitted through the substrate 200, as shown in FIG. 4A. Alternatively, when the first electrode 201 has a light transmitting property and the second electrode 202 has a light shielding property (in particular, a light reflecting property), light can be emitted through the opposite side of the substrate 200, as shown in FIG. 4B. Further, when both the first electrode 201 and the second electrode 202 are formed to have light transmitting properties, light can be emitted both through the substrate 200 and the opposite side of the substrate 200, as shown in FIG. 4C.

It is also possible to employ a structure in which the first layer 211 contains one compound selected from metal oxide and a compound having a strong electron transporting property, the second layer 212 contains a substance having a light emitting property, the third layer 213 is a layer having low activation energy, which is described in Embodiment Mode 2 and Embodiment Mode 3, and the fourth layer 214 contains one compound selected from metal oxide and a compound having a strong electron transporting property.

Moreover, the light emitting elements in this embodiment mode can be formed by using any known method regardless of a wet type method and a dry type method.

Furthermore, after forming the first electrode 201, the first layer 211, the second layer 212, the third layer 213 and the fourth layer 214 may be sequentially laminated over the first electrode 201, and then the second electrode 202 may be formed thereover. Alternatively, after forming the second electrode 202, the fourth layer 214, the third layer 213, the second layer 212 and the first layer 211 may be sequentially laminated over the second electrode 202, and then the first electrode 201 may be formed thereover.

Embodiment Mode 5

A circuit structure and a driving method of a light emitting device having a display function will be described with reference to FIG. 5, FIG. 6, FIG. 7, and FIG. 8.

Figure 5:
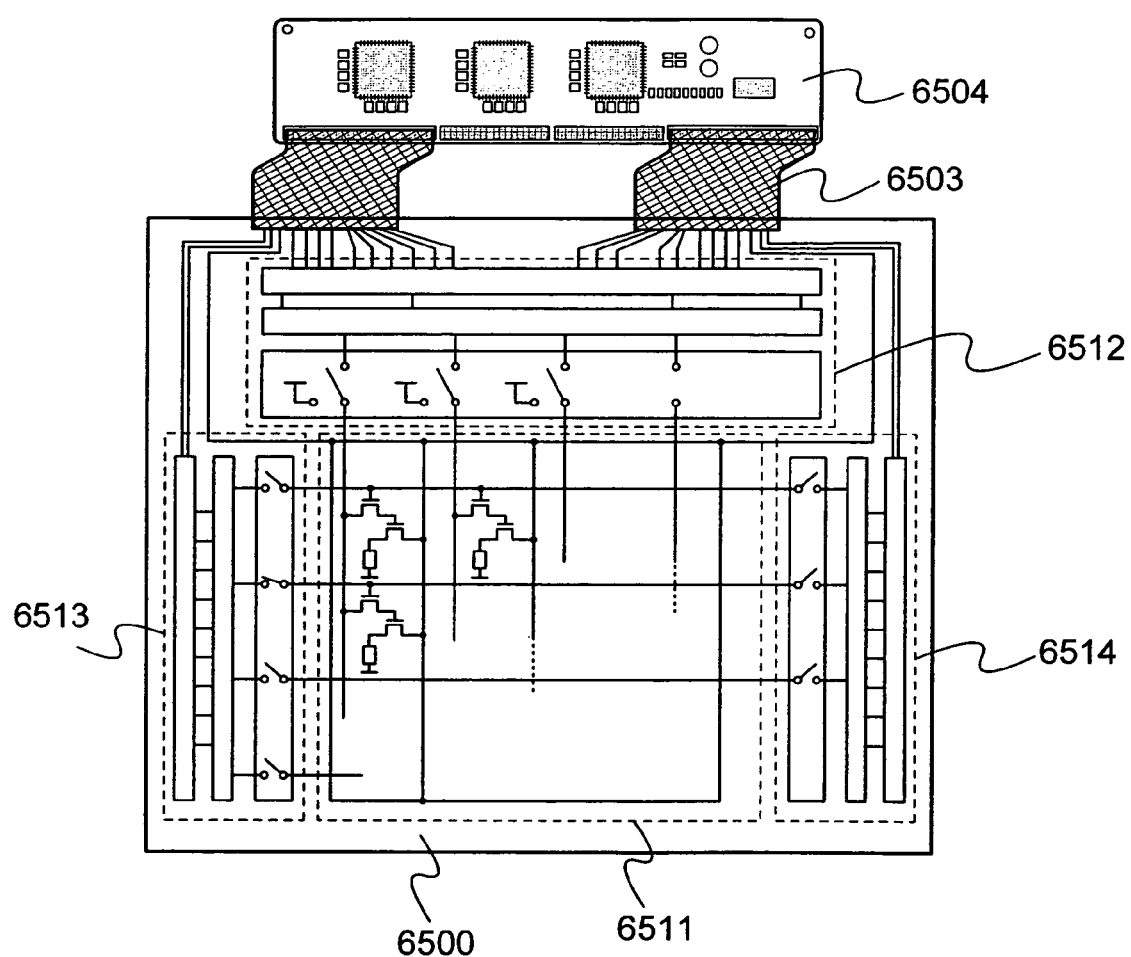
FIG. 5 is a top view explaining a light emitting device of the present invention.

FIG. 5 is a schematic top view of a light emitting device to which the present invention is applied. In FIG. 5, a pixel portion 6511, a source signal line driver circuit 6512, a writing gate signal line driver circuit 6513, and an erasing gate signal line driver circuit 6514 are provided over a substrate 6500. The source signal line driver circuit 6512, the writing gate signal line driver circuit 6513, and the erasing gate signal line driver circuit 6514 are respectively connected to FPCs (flexible printed circuits) 6503, which are external input terminals, through wiring groups. The source signal line driver circuit 6512, the writing gate signal line driver circuit 6513, and the erasing gate signal line driver circuit 6514 receive video signals, clock signals, start signals, reset signals and the like from the FPCs 6503, respectively. The FPCs 6503 are attached with a printed wiring board (PWB) 6504. Further, a driver circuit portion is not necessary to be formed over the same substrate as the pixel portion 6511. For example, the driver circuit portion may be provided outside of the substrate by utilizing a TCP in which an IC chip is mounted over an FPC having a wiring pattern, or the like.

A plurality of source signal lines extending in columns are aligned in rows in the pixel portion 6511. Also, power supply lines are aligned in rows. A plurality of gate signal lines extending in rows are aligned in columns in the pixel portion 6511. In addition, a plurality of circuits each including a light emitting element are aligned in the pixel portion 6511.

Figure 6:
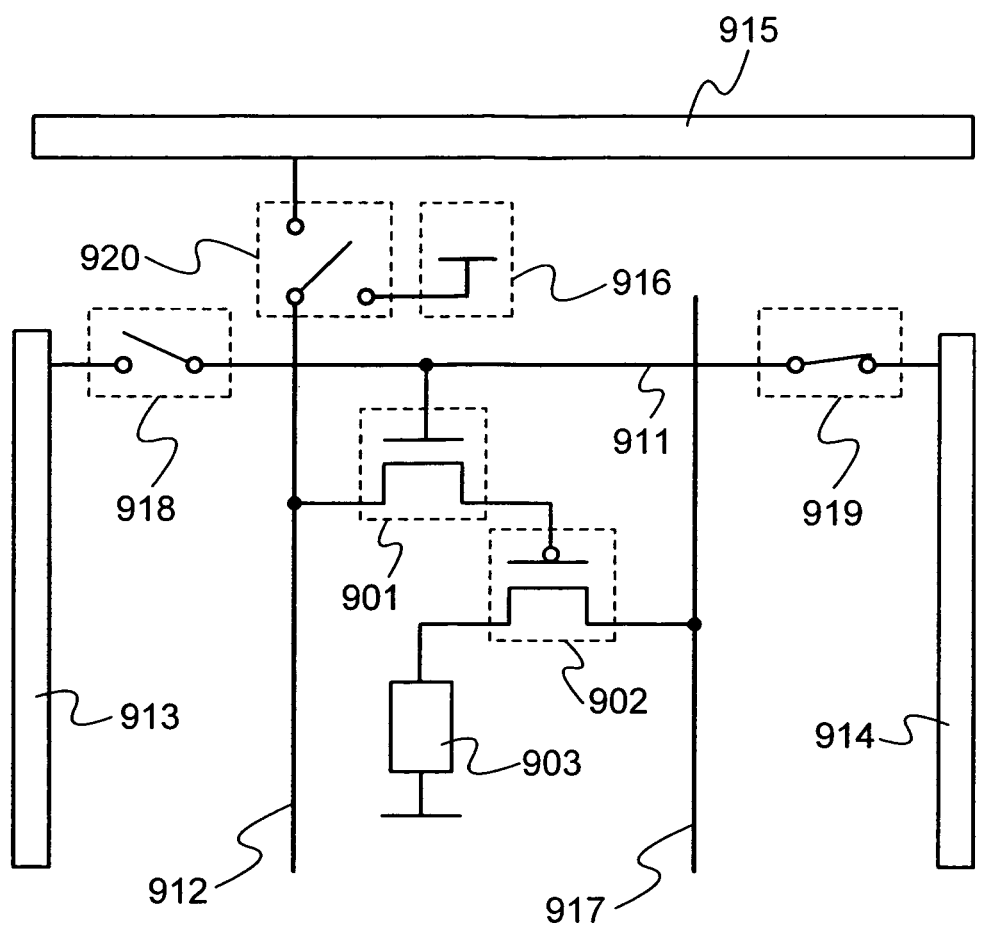
FIG. 6 is a diagram explaining a circuit included in a light emitting device to which the present invention is applied.

FIG. 6 is a diagram showing a circuit for operating one pixel. The circuit as shown in FIG. 6 includes a first transistor 901, a second transistor 902, and a light emitting element 903.

Each of the first and second transistors 901 and 902 is a three terminal element including a gate electrode, a drain region and a source region. A channel region is interposed between the drain region and the source region. Since a region serving as the source region and a region serving as the drain region are changed depending on a structure of a transistor, an operational condition and the like, it is difficult to determine which region serves as the source region or the drain region. Therefore, regions serving as the source or the drain are denoted as a first electrode of a transistor and a second electrode of a transistor in this embodiment mode, respectively.

A gate signal line 911 and a writing gate signal line driver circuit 913 are provided to be electrically connected or disconnected to each other by a switch 918. The gate signal line 911 and an erasing gate signal line driver circuit 914 are provided to be electrically connected or disconnected to each other by a switch 919. A source signal line 912 is provided to be electrically connected to either a source signal line driver circuit 915 or a power source 916 by a switch 920. A gate of the first transistor 901 is electrically connected to the gate signal line 911. The first electrode of the first transistor is electrically connected to the source signal line 912 while the second electrode of the first transistor is electrically connected to a gate electrode of the second transistor 902. The first electrode of the second transistor 902 is electrically connected to a current supply line 917 while the second electrode of the second transistor is electrically connected to one electrode included in the light emitting element 903. Further, the switch 918 may be included in the writing gate signal line driver circuit 913. The switch 919 may also be included in the erasing gate signal line driver circuit 914. In addition, the switch 920 may be included in the source signal line driver circuit 915.

Figure 7:
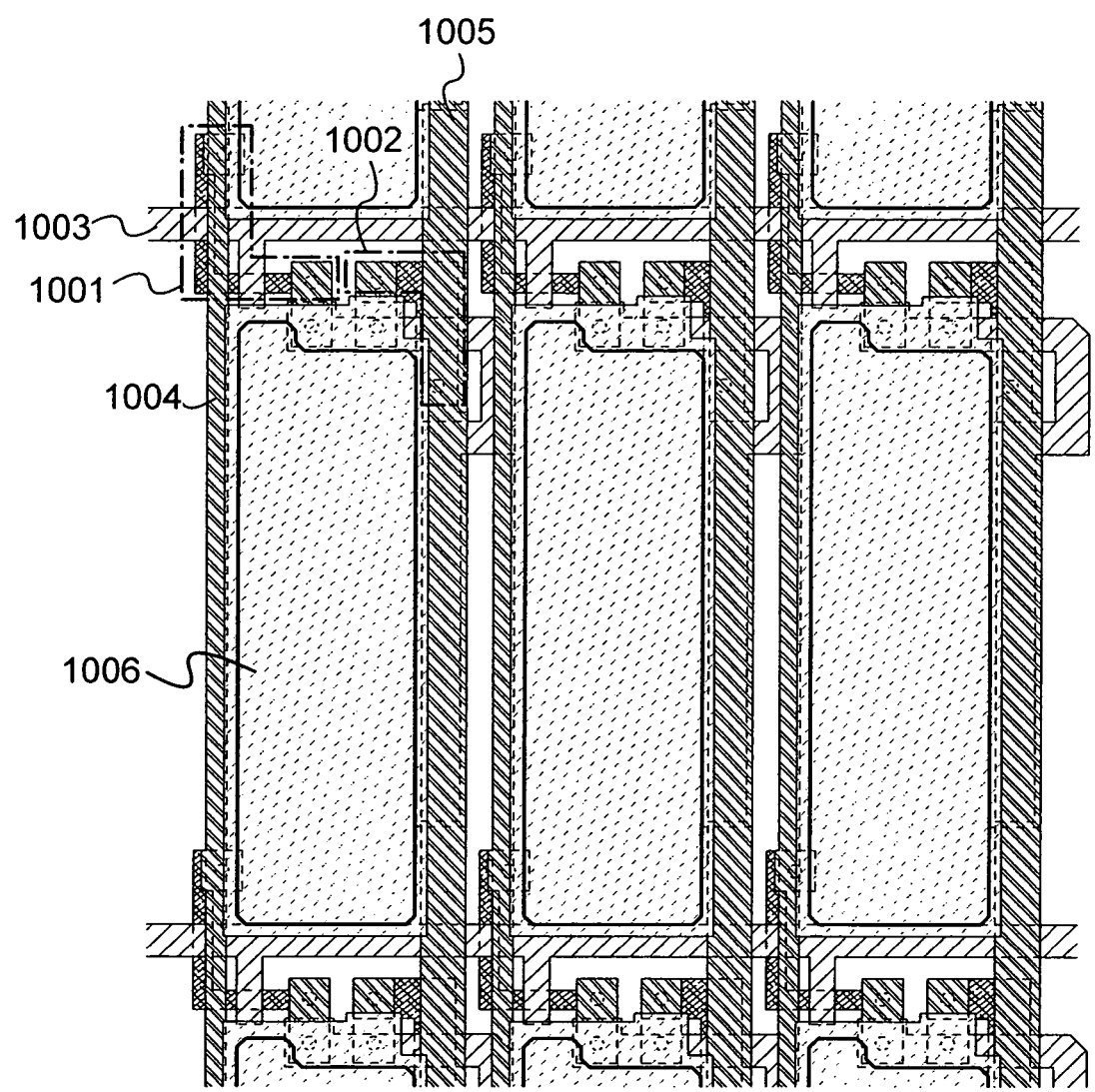
FIG. 7 is a top view of a light emitting device to which the present invention is applied.

The arrangement of transistors, light emitting elements and the like in the pixel portion is not particularly limited. For example, the arrangement as shown in a top view of FIG. 7 can be employed. In FIG. 7, a first electrode of a first transistor 1001 is connected to a source signal line 1004 while a second electrode of the first transistor is connected to a gate electrode of a second transistor 1002. A first electrode of the second transistor is connected to a current supply line 1005 and a second electrode of the second transistor is connected to an electrode 1006 of a light emitting element. A part of the gate signal line 1003 functions as a gate electrode of the first transistor 1001.

Figure 8:
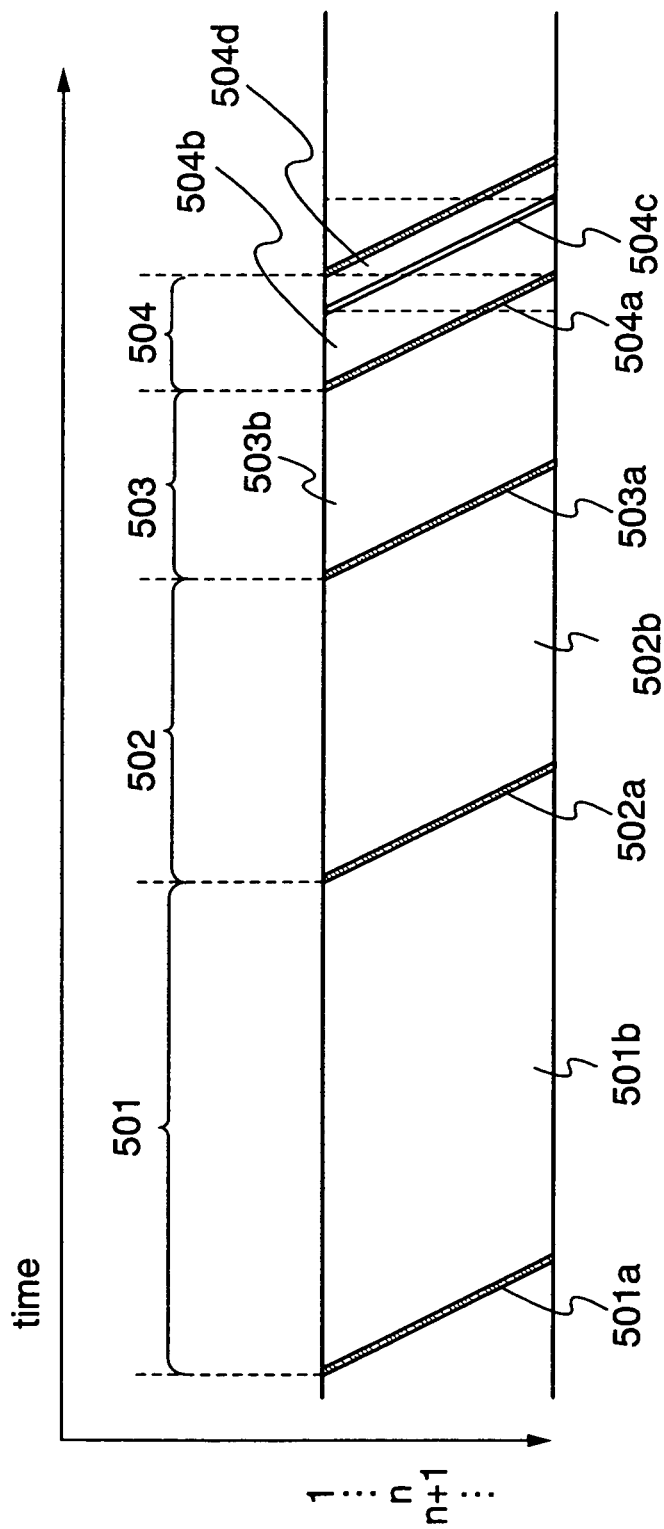
FIG. 8 is a diagram explaining an operation in one frame of a light emitting device to which the present invention is applied.

Next, the method for driving the light emitting device will be described below. FIG. 8 is a diagram explaining an operation of one frame with time. In FIG. 8, a horizontal direction indicates time passage while a longitudinal direction indicates the number of scanning stages of a gate signal line.

When an image is displayed on the light emitting device of the present invention, a rewriting operation and a displaying operation are carried out alternately during a displaying period. The number of the rewriting operations is not particularly limited. However, the rewriting operation is preferably performed about 60 times a second such that a person who watches a displayed image does not detect flicker in the image. A period of operating the rewriting operation and the displaying operation of one image (one frame) is, herein, referred to as one frame period.

As shown in FIG. 8, one frame is divided into four sub-frames 501, 502, 503 and 504 including writing periods 501a, 502a, 503a and 504a and holding periods 501b, 502b, 503b and 504b. The light emitting element applied with a signal for emitting light, emits light during the holding periods. The length ratio of the holding periods in the first sub-frame 501, the second sub-frame 502, the third sub-frame 503 and the fourth sub-frame 504 satisfies $2^3:2^2:2^1:2^0=8:4:2:1$. This allows the light emitting device to exhibit 4-bit gray scale. Further, the number of bits and the number of gray scales are not limited to those as shown in this embodiment mode. For instance, one frame may be divided into eight sub-frames so as to achieve 8-bit gray scale.

The operation in one frame will be described. In the sub-frame 501, the writing operation is first performed in a $1^{st}$ row to a last row, sequentially. Therefore, the starting time of the writing periods is varied for each row. The holding period 501b sequentially starts in the rows in which the writing period 501a has been terminated. In the holding period 501b, a light emitting element applied with a signal for emitting light, remains in a light emitting state. Upon terminating the holding period 501b, the sub-frame 501 is changed to the next sub-frame 502 sequentially in the rows. In the sub-frame 502, a writing operation is sequentially performed in the $1^{st}$ row to the last row in the same manner as the sub-frame 501, The above-mentioned operations are carried out repeatedly up to the holding period 504b of the sub-frame 504 and then terminated. After terminating the operation in the sub-frame 504, an operation in the next frame starts. Accordingly, the sum of the light-emitting time in respective sub-frames corresponds to the light emitting time of each light emitting element in one frame. By changing the light emitting time for each light emitting element and combining such the light emitting elements variously within a pixel portion, various display colors with different brightness and different chromaticity can be obtained.

When the holding period is intended to be forcibly terminated in the row in which the writing period has already been terminated and the holding period has started prior to terminating the writing operation up to the last row as shown in the sub-frame 504, an erasing period 504c is preferably provided after the holding period 504b so as to stop light emission forcibly. The row where light emission is forcibly stopped, does not emit light for a certain period (this period is referred to as a non light emitting period 504d). Upon terminating the writing period in the last row, a writing period of a next sub-frame (or, a next frame) immediately starts from a first row, sequentially. This can prevent the writing period in the sub-frame 504 from overlapping with the writing period in the next sub-frame.

Although the sub-frames 501 to 504 are arranged in order of descending the length of the holding period in this embodiment mode, they are not necessary to be arranged in this order. For example, the sub-frames may be arranged in ascending order of the length of the holding period. Alternatively, the sub-frames may be arranged in random order. In addition, these sub-frames may further be divided into a plurality of frames. That is, scanning of gate signal lines may be performed at several times during a period of supplying same video signals.

The operations in the wiring period and the erasing period of the circuits as shown in FIG. 6 will be described below.

First, the operation in the writing period will be described. In the writing period, the gate signal line 911 in the n-th row (n is a natural number) is electrically connected to the writing gate signal line driver circuit 913 via the switch 918. The gate signal line 911 in the n-th row is electrically disconnected to the erasing gate signal line driver circuit 914. The source signal line 912 is electrically connected to the source signal line driver circuit 915 via the switch 920. In this case, a signal is input in a gate of the first transistor 901 connected to the gate signal line 911 in the n-th row (n is a natural number), thereby turning the first transistor 901 on. At this moment, video signals are simultaneously input in the source signal lines in the first to last columns. Further, the video signals input from the source signal line 912 in each column are independent from one another. The video signals input from the source signal line 912 are input in a gate electrode of the second transistor 902 via the first transistor 901 connected to the respective source signal lines. It is decided whether the current supply line 917 and the light emitting element 903 are electrically conducted or not electrically conducted to each other and whether the light emitting element 903 emits light or emits no light depending on a signal input in the second transistor 902. For instance, when the second transistor 902 is of a P-channel type, the light emitting element 903 emits light by inputting a low level signal in the gate electrode of the second transistor 902. On the other hand, when the second transistor 902 is of an N-channel type, the light emitting element 903 emits light by inputting a high level signal in the gate electrode of the second transistor 902.

Next, the operation in the erasing period will be described. In the erasing period, the gate signal line 911 in the n-th row (n is a natural number) is electrically connected to the erasing gate signal line driver circuit 914 via the switch 919. The gate signal line 911 in the n-th row is electrically disconnected to the writing gate signal line driver circuit 913. The source signal line 912 is electrically connected to the power source 916 via the switch 920. In this case, upon inputting a signal in the gate of the first transistor 901, which is connected to the gate signal line 911 in the n-th row, the first transistor 901 is turned on. At this time, erasing signals are simultaneously input in the first to last columns of the source signal lines. The erasing signals input from the source signal line 912 are input in the gate electrode of the second transistor 902 via the first transistor 901, which is connected to each source signal line. At this time, the current supply line 917 and the light emitting element 903 becomes an electrically non-conductive state by a signal input in the second transistor 902. This makes the light emitting element 903 emit no light forcibly. For example, when the second transistor 902 is of a P-channel type, the light emitting element 903 emits no light by inputting a high level signal in the gate electrode of the second transistor 902. On the other hand, when the second transistor 902 is of an N-channel type, the light emitting element 903 emits no light by inputting a low level signal in the gate electrode of the second transistor 902.

Further, in the erasing period, a signal for erasing is input in the n-th row (n is a natural number) by the above-mentioned operation. However, as mentioned above, the n-th row sometimes remains in the erasing period while another row (e.g., an m-th row (m is a natural number)) remains in the writing period. In this case, since a signal for erasing is necessary to be input in the n-th row and a signal for writing is necessary to be input in the m-th row by utilizing the source signal line in the same column, the after-mentioned operation is preferably carried out.

After the light emitting element 903 in the n-th row becomes a non-light emitting state by the above-described operation in the erasing period, the gate signal line 911 and the erasing gate signal line driver circuit 914 are immediately disconnected to each other and the source signal line 912 is connected to the source signal line driver circuit 915 by turning the switch 920 on/off. The gate signal line 911 and the writing gate signal line driver circuit 913 are connected to each other while the source signal line and the source signal line driver circuit 915 are connected to each other. A signal is selectively input in the signal line in the m-th row from the writing gate signal line driver circuit 913 and the first transistor is turned on while signals for writing are input in the source signal lines in the first to last columns from the source signal line driver circuit 915. By these signals, the light emitting element in the m-th row emits light or no light.

After terminating the writing period in the m-th row as mentioned above, the erasing period immediately starts in the n+1-th row. Therefore, the gate signal line 911 and the writing gate signal line driver circuit 913 are disconnected to each other while the source signal line is connected to the power source 916 by turning the switch 920 on/off. Also, the gate signal line 911 and the writing gate signal line driver circuit 913 are disconnected to each other while the gate signal line 911 is connected to the erasing gate signal line driver circuit 914. A signal is selectively input in the gate signal line in the n+1-th row from the erasing gate signal line driver circuit 914 to input a signal for turning on the first transistor in the first transistor while an erasing signal is input therein from the power source 916. Upon terminating the erasing period in the n+1-th row in this manner, the writing period immediately starts in the m-th row. The erasing period and the writing period may be repeated alternately until the erasing period of the last row in the same manner.

Although the writing period in the m-th row is provided between the erasing period in the n-th row and the erasing period of the n+1-th row in this embodiment mode, the present invention is not limited thereto. The writing period of the m-th row may be provided between the erasing period in the n−1-th row and the erasing period in the n-th row.

Furthermore, in this embodiment mode, when the non-light emitting period 504d is provided like the sub-frame 504, the operation of disconnecting the erasing gate signal line driver circuit 914 from one gate signal line while connecting the writing gate signal line driver circuit 913 to other gate signal line, is carried out repeatedly. This operation may be performed in a frame in which a non-light emitting period is not particularly provided.

Embodiment Mode 6

Examples of cross sections of light emitting devices having light emitting elements of the present invention will be described with reference to FIGS. 9A to 9C.

Figure 9A:
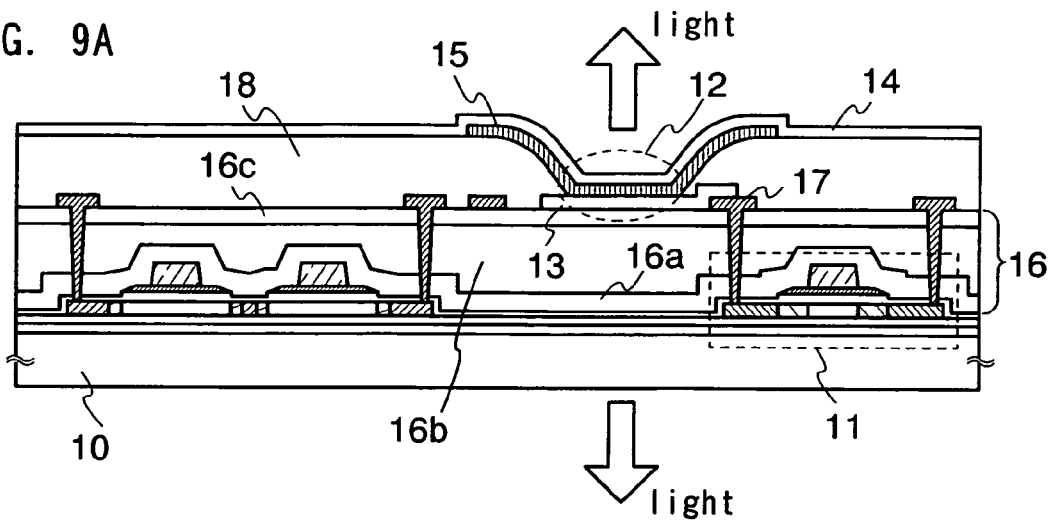
FIGS. 9A to 9C are cross sectional views of light emitting devices to which the present invention is applied.
Figure 9B:
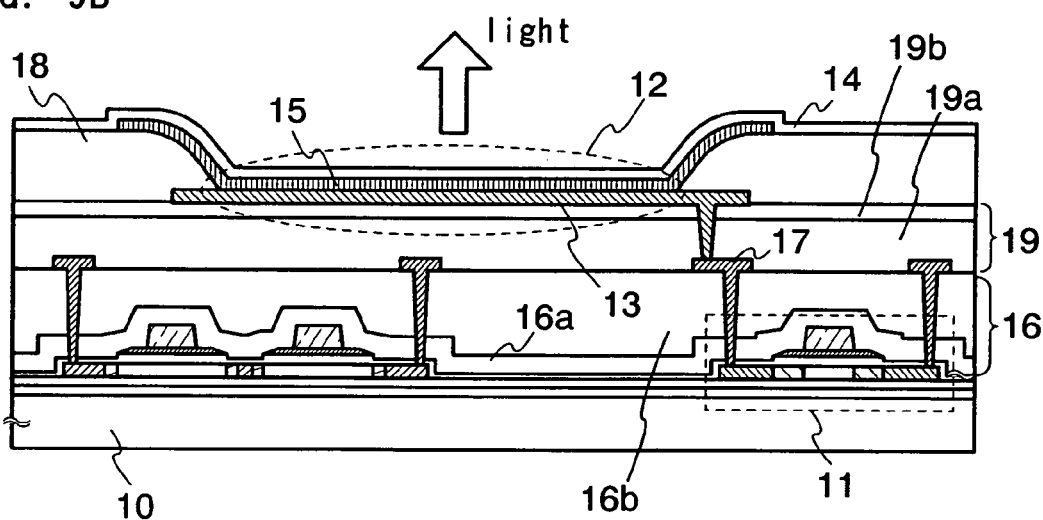
Figure 9C:
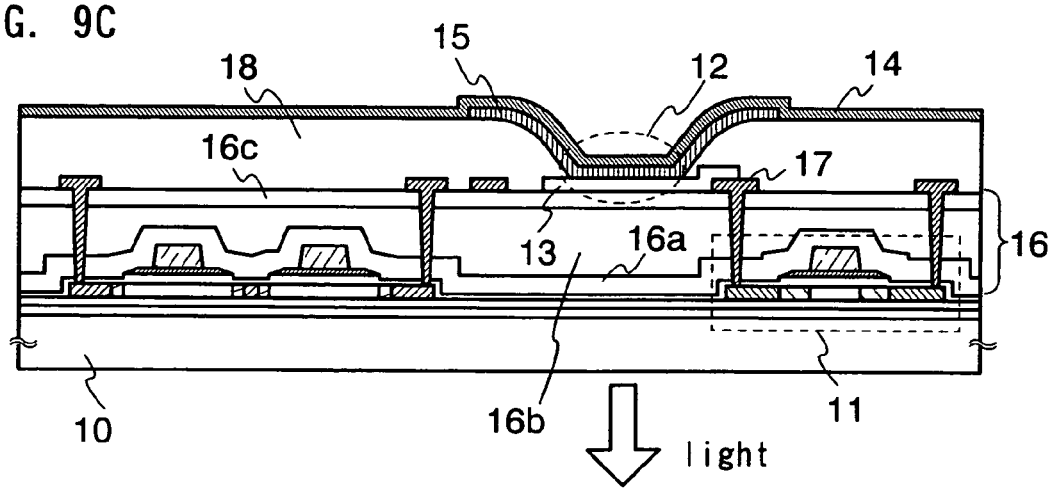

In each of FIGS. 9A to 9C, a transistor 11 that is provided for driving a light emitting element 12 of the present invention is surrounded by a dashed line. The light emitting element 12 of the present invention includes a layer 15 in which a layer containing a light emitting substance and a layer having low activation energy of electrical conductivity are laminated, between a first electrode 13 and a second electrode 14. A drain of the transistor 11 and the first electrode 13 are electrically connected to each other via a wiring 17 that passes through a first interlayer insulating film 16 (16a, 16b and 16c). The light emitting element 12 is isolated from other adjacent light emitting element by a partition wall layer 18. A light emitting device having such a structure is provided over a substrate 10 in this embodiment mode.

The transistor 11 shown in each of FIGS. 9A to 9C is of a top-gate type in which a gate electrode is provided on a semiconductor layer at a side opposite to the substrate. Further, the structure of the transistor 11 is not particularly limited thereto, and for example, a bottom-gate type structure may be employed. In the case of the bottom-gate type, either a structure in which a protection film is formed over a semiconductor layer forming a channel (a channel protection type) or a structure in which a semiconductor layer forming a channel is partly etched (a channel-etched type) may be used.

Furthermore, a semiconductor layer included in the transistor 11 may be formed using any one of a crystalline semiconductor, an amorphous semiconductor, a semiamorphous semiconductor, and the like.

Specifically, the semiamorphous semiconductor has an intermediate structure between an amorphous structure and a crystalline structure (including a single crystal structure and a polycrystalline structure), and a third condition that is stable in term of free energy. The semiamorphous semiconductor further includes a crystalline region having a short range order along with lattice distortion. A crystal grain with a size of 0.5 to 20 nm is included in at least a part of a semiamorphous semiconductor film. Raman spectrum is shifted toward lower wavenumbers than 520 cm$^{-1}$. The diffraction peaks of (111) and (220), which are believed to be derived from Si crystal lattice, are observed in the semiamorphous semiconductor by the X-ray diffraction. The semiamorphous semiconductor contains hydrogen or halogen of at least 1 atom % or more so as to terminate dangling bonds. The semiamorphous semiconductor is also referred to as a so-called microcrystalline semiconductor. The semiamorphous semiconductor is formed by glow discharge decomposition (plasma CVD) with a gas containing silicon. As for the gas containing silicon, $SiH_4$, $Si_2H_6$, $SiH_2Cl_2$, $SiHCl_3$, $SiCl_4$, $SiF_4$ and the like can be used. The gas containing silicon may also be diluted with $H_2$, or a mixture of $H_2$ and one or more of rare gas elements selected from He, Ar, Kr and Ne. The dilution ratio is set to be in the range of 1:2 to 1:1,000. The pressure is set to be approximately in the range of 0.1 to 133 Pa. The power frequency is set to be 1 to 120 MHz, and preferably, 13 to 60 MHz. A substrate heating temperature may be set to be 300° C. or less, and preferably, 100 to 250° C. With respect to impurity elements contained in the film, each concentration of impurities for atmospheric constituents such as oxygen, nitrogen and carbon, is preferably set to be $1\times10^{20}/cm^3$ or less. In particular, the oxygen concentration is set to be $5\times10^{19}/cm^3$ or less, and preferably, $1\times10^{19}/cm^3$ or less. Moreover, mobility of a TFT (thin film transistor) using a semiamorphous semiconductor or the like, is about 1 to 10 m$^2$/Vsec.

As a specific example of a crystalline semiconductor layer, a semiconductor layer made from single crystal silicon, polycrystalline silicon, silicon germanium, or the like can be given. The crystalline semiconductor layer may be formed by laser crystallization. For example, the crystalline semiconductor layer may be formed by crystallization with use of a solid phase growth method using nickel or the like.

When a semiconductor layer is formed using an amorphous substance, e.g., amorphous silicon, it is preferable to use a light emitting device comprising a circuit which includes only N-channel transistors as the transistor 11 and other transistor (a transistor included in a circuit for driving a light emitting element). Alternatively, a light emitting device comprising a circuit which includes either N-channel transistors or P-channel transistors, may be employed. Also, a light emitting device comprising a circuit which includes both an N-channel transistor and a P-channel transistor, may be used.

The first interlayer insulating film 16 may include either plural layers as shown in FIGS. 9A to 9C or a single layer. Specifically, an interlayer insulating layer 16a is formed using an inorganic material such as silicon oxide and silicon nitride. An interlayer insulating layer 16b is formed using acrylic, siloxane (which is a substance that has a skeleton structure formed by a silicon (Si)-oxygen (O) bond and includes at least hydrogen in a substituent), or a substance with a self-planarizing property that can be formed by applying a liquid such as silicon oxide. An interlayer insulating layer 16c is formed using a silicon nitride film containing argon (Ar). Further, the substances constituting the respective layers are not particularly limited thereto. Therefore, substances other than the above-mentioned substances may be employed. Alternatively, a layer formed using a substance other than the above mentioned substances may be provided in combination with the above described layers. Accordingly, the first interlayer insulating film 16 may be formed by using both an inorganic material and an organic material or by using either an inorganic material or an organic material.

The edge portion of the partition wall layer 18 preferably has a shape in which the radius of curvature is continuously varied. This partition wall layer 18 is formed by using acrylic, siloxane, resist, silicon oxide, or the like. Further, the partition wall layer 18 may be formed using any one or both of an inorganic film and an organic film.

Each of FIGS. 9A and 9C shows the structure in which only the first interlayer insulating film 16 is provided between the transistors 11 and the light emitting elements 12. Alternatively, as shown in FIG. 9B, the first interlayer insulating film 16 (first interlayer insulating layers 16a and 16b) and a second interlayer insulting film 19 (second interlayer insulting layers 19a and 19b) may be provided between the transistor 11 and the light emitting element 12. In the light emitting device as shown in FIG. 9B, the first electrode 13 passes through the second interlayer insulating film 19 to be connected to the wiring 17.

The second interlayer insulating film 19 may include either plural layers or a single layer as well as the first interlayer insulating film 16. A second interlayer insulating layer 19a is formed using acrylic, siloxane (which is a substance having a skeleton structure formed by a silicon (Si)-oxygen (O) bond and containing at least hydrogen in a substituent), or a substance with a self-planarizing property that can be formed by applying a liquid such as silicon oxide. A second interlayer insulating layer 19b is formed using a silicon nitride film containing argon (Ar). The substances constituting the respective layers of the second interlayer insulating film are not particularly limited thereto. Therefore, substances other than the above-mentioned substances may be employed. Alternatively, a layer made from a substance other than the above-mentioned substances may be provided in combination with the layers 19a and 19b. Accordingly, the second interlayer insulating film 19 may be formed by using both an inorganic material and an organic material or by using either an inorganic material or an inorganic material.

When the first electrode and the second electrode are both formed using a substance with a light transmitting property in the light emitting element 12, light generated in the light emitting element can be emitted through both the first electrode 13 and the second electrode 14 as shown in arrows in FIG. 9A. When only the second electrode 14 is formed using a substance with a light transmitting property, light generated in the light emitting element 12 can be emitted only through the second electrode 14 as shown in an arrow of FIG. 9B. In this case, the first electrode 13 is preferably formed using a material with high reflectance. Alternatively, a film (reflection film) formed using a material with high reflectance is preferably provided underneath the first electrode 13. When only the first electrode 13 is formed using a substance with a light transmitting property, light generated in the light emitting element 12 can be emitted only through the first electrode 13 as shown in an arrow of FIG. 9C. In this case, the second electrode 14 is preferably formed using a material with high reflectance or a reflection film is preferably provided over the second electrode 14.

Moreover, the layer 15 may be stacked so that the light emitting element 12 operates, when applying voltage thereto such that a potential of a first electrode 13 is higher than that of a second electrode 14. Alternatively, the layer 15 in which the layer containing a light emitting substance and a layer having low activation energy of electrical conductivity are laminated, may be stacked in the light emitting element 12 so as to operate the light emitting element when applying voltage to the light emitting element such that a potential of a second electrode 14 is lower than that of a first electrode 13. In the former case, a transistor 11 is an N-channel transistor. In the latter case, a transistor 11 is a P-channel transistor.

As set forth above, an active matrix light emitting device, which controls a light emitting element by using a transistor, is described in this embodiment mode. Alternatively, a passive light emitting device, which drives a light emitting element without providing a driving element such as a transistor, may also be employed. In the passive light emitting device, utilizing a light emitting element of the present invention, which is driven at low driving voltage, makes it possible to drive the light emitting element at low power consumption.

Embodiment Mode 7

Since a light emitting device comprising a light emitting element of the present invention can display favorable images, by applying the light emitting device of the present invention to a display portion of an electronic appliance, favorable images can be displayed on the display portion. In addition, since a light emitting device comprising a light emitting element of the present invention is driven at low power consumption, by applying the light emitting device of the present invention to a display portion of an electronic appliance, power consumption can be reduced. For example, a telephone set having long standby time, can be obtained.

Figure 10A:
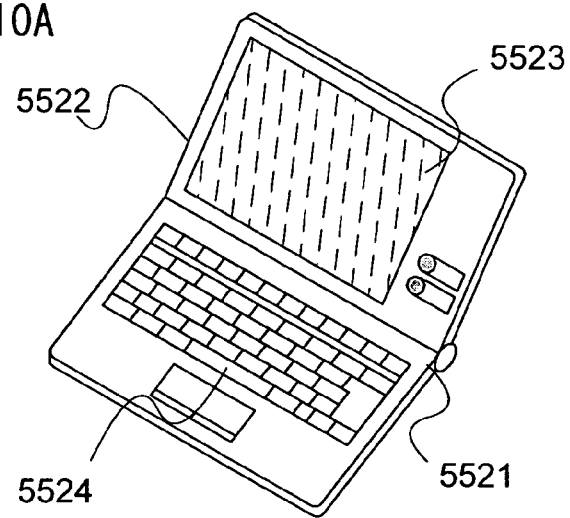
FIGS. 10A to 10C are diagrams showing electronic appliances to which the present invention is applied.
Figure 10B:
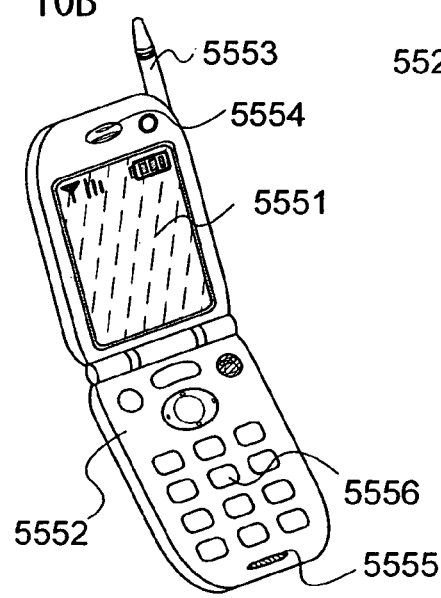
Figure 10C:
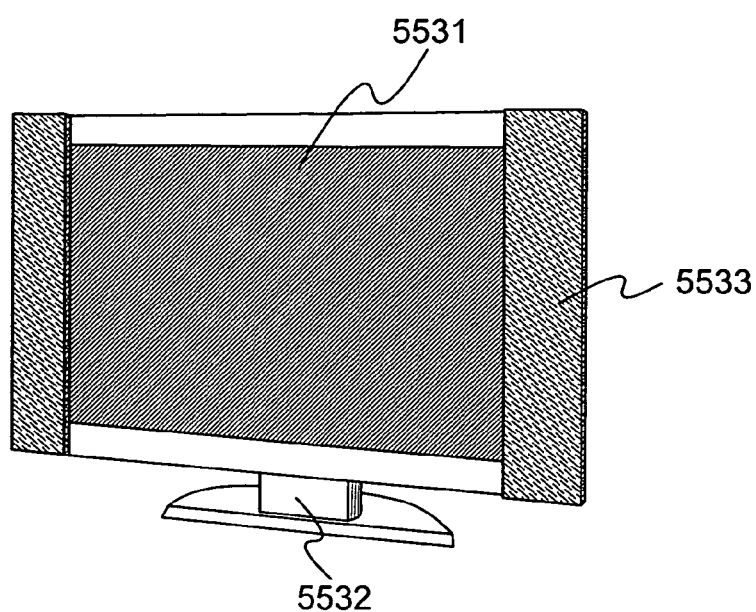

Examples of electronic appliances comprising light emitting devices to which the present invention is applied, are shown in FIGS. 10A to 10C.

FIG. 10A shows a computer manufactured in accordance with the present invention, including a main body 5521, a housing 5522, a display portion 5523, a keyboard 5524, and the like. By incorporating a light emitting device having a light emitting element of the present invention in the display portion, the computer can be completed.

FIG. 10B shows a telephone set manufactured in accordance with the present invention, including a main body 5552, a display portion 5551, a sound output portion 5554, a sound input portion 5555, operations switches 5556 and 5557, an antenna 5553, and the like. By incorporating a light emitting device having a light emitting element of the present invention in the display portion, the telephone set can be completed.

FIG. 10C shows a television set manufactured in accordance with the present invention, including a display portion 5531, a housing 5532, a speaker 5533, and the like. By incorporating a light emitting device having a light emitting element of the present invention as the display portion, the television set can be completed.

As set forth above, a light emitting device of the present invention is greatly suitable for a display portion of various kinds of electronic appliances.

Further, although only the computer, the telephone set and the television set are described in this embodiment mode, light emitting devices comprising light emitting elements of the present invention may be implemented in a navigation device, a lighting device, and the like.

Example 1

Synthetic Example

A method for synthesizing N,N'-bis(spiro-9,9'-bifluorene-2-yl)-N,N'-diphenylbenzidine (abbreviation: BSPB), which is represented by the following structural formula (1), will be described.

[structural formula (1)]

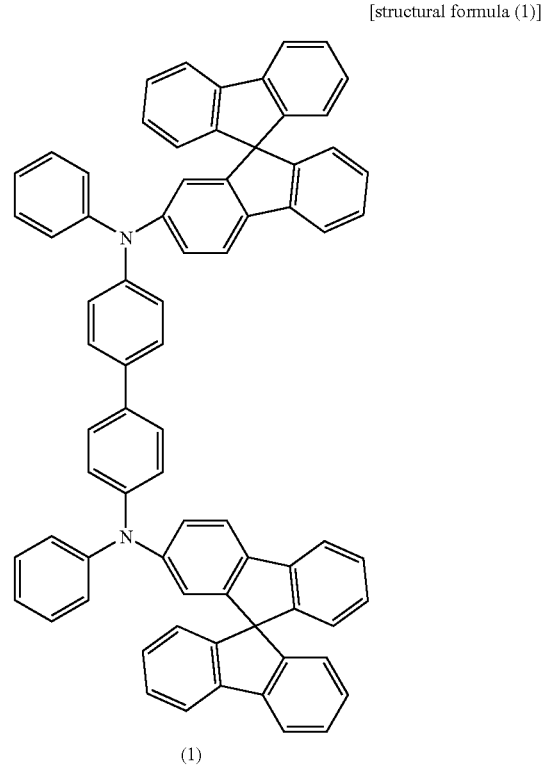 [SMILES: c1ccc(N(c2ccc(-c3ccc(N(c4ccccc4)c4ccc5c(c4)C4(c6ccccc6-c6ccccc64)c4ccccc4-5)cc3)cc2)c2ccc3c(c2)C2(c4ccccc4-c4ccccc42)c2ccccc2-3)cc1]

(1)

[Step 1]

A method for synthesizing 2-bromo-spiro-9,9'-bifluorene, will be described.

Specifically, 1.26 g (0.052 mol) of magnesium was poured in a three-neck flask (100 ml), and the flask was evacuated. The magnesium was stirred for 30 minutes while heating to activate the magnesium. The magnesium was cooled to room temperature, and then the flask is filled with nitrogen airflow. Under the nitrogen, 5 ml of diethyl ether and a few drops of dibromoethane were added, and then 11.65 g (0.050 mol) of 2-bromobiphenyl, which was dissolved in 15 ml of diethyl ether, was slowly dropped into the flask. After termination of the dropping, the mixture was refluxed for 3 hours to obtain a Grignard reagent. Next, 11.7 g (0.045 mol) of 2-bromofluorene and 40 ml of diethyl ether were poured in a three-neck flask (200 ml). The Grignard reagent synthesized previously was slowly dropped into the reaction solution. After termination of the dropping, the mixture was refluxed for 2 hours, and then the mixture was further stirred for overnight at the room temperature. After termination of reaction, the reaction solution was washed two times with a saturated ammonia chloride solution. A water layer was extracted two times with ethyl acetate, and then the extract and an organic layer were washed with saturated saline. After the organic layer was dried with magnesium sulfate, the resultant was filtered by suction, and the filtrate was concentrated to obtain 18.76 g (yield: 90%) of a solid of 9-(2-biphenylyl)-2-bromo-9-fluorenol.

Next, 18.76 g (0.045 mol) of 9-(2-biphenylyl)-2-bromo-9-fluorenol, which was synthesized above, and 100 ml of glacial acetic acid were poured in a three-neck flask (200 ml), a few drops of concentrated hydrochloric acid were added thereto, and then the mixture was refluxed for 2 hours. After the termination of reaction, the precipitate was collected by suction filtration, and the precipitate was filtered and washed with a saturated sodium hydrogen carbonate solution and water. The thus obtained brown solid was recrystallized with ethanol to obtain 10.24 g (yield: 57%) of a brown powder. It was confirmed that this brown powder was 2-bromo-spiro-9,9'-bifluorene, by nuclear magnetic resonance ($^1$H-NMR). The $^1$H-NMR of this compound is as follows.

The $^1$H-NMR of this compound is shown below. The $^1$H-NMR (300 MHz, CDCl$_3$) δ ppm: 7.86-7.79 (m, 3H), 7.70 (d, 1H, J=8.4 Hz), 7.47-7.50 (m, 1H), 7.41-7.34 (m, 3H), 7.12 (t, 3H, J=7.7 Hz), 6.85 (d, 1H, J=2.1 Hz), and 6.74-6.70 (m, 3H).

Further, a synthetic scheme (b-1) of the synthetic method described above is shown below.

[structural formula (2)]

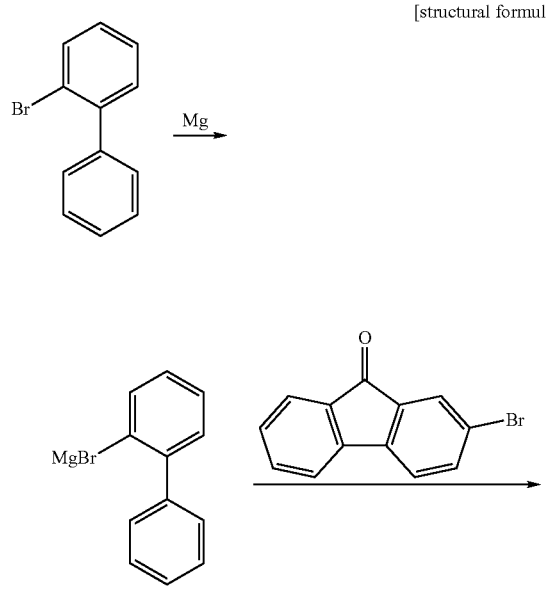

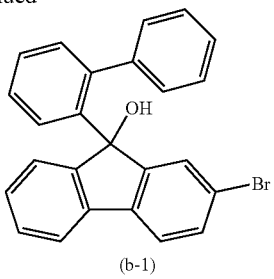

(b-1)

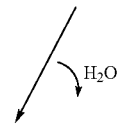

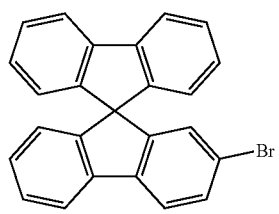

[Step 2]

A method for synthesizing N,N'-bis(spiro-9,9'-bifluorene-2-yl)-N,N'-diphenylbenzidine (abbreviation: BSPB), will be described.

Specifically, 1.00 g (0.0030 mol) of N,N'-diphenylbenzidine, 2.49 g (0.0062 mol) of 2-bromo-spiro-9,9'-bifluorene, which was synthesized in accordance with the synthetic method of Step 1, 170 mg (0.30 mmol) of bis(dibenzylideneacetone) palladium, and 1.08 g (0.011 mol) of tert-butoxysodium were poured in a three-neck flask (100 ml). After filling the three-neck flask with nitrogen airflow, 20 ml of dehydrated toluene and 0.6 ml of a hexane solution containing 10% of tri-tert-butylphosphine were added, and then the mixture was stirred for 6 hours at 80° C. After the termination of reaction, the reaction solution was cooled to room temperature, and then added with water. Subsequently, a solid precipitated from the reaction solution was collected by suction filtration, and the solid was washed with dichloromethane. The thus obtained white solid was purified by alumina column chromatography (chloroform), and the purified white solid was recrystallized with dichloromethane to obtain 2.66 g (yield: 93%) of a white powder.

A synthetic scheme (b-2) of the synthetic method described above will be shown below. As described above, a compound of the present invention can be synthesized by a coupling reaction of N,N'-diphenylbenzidine and 2-bromo-spiro-9,9'-bifluorene.

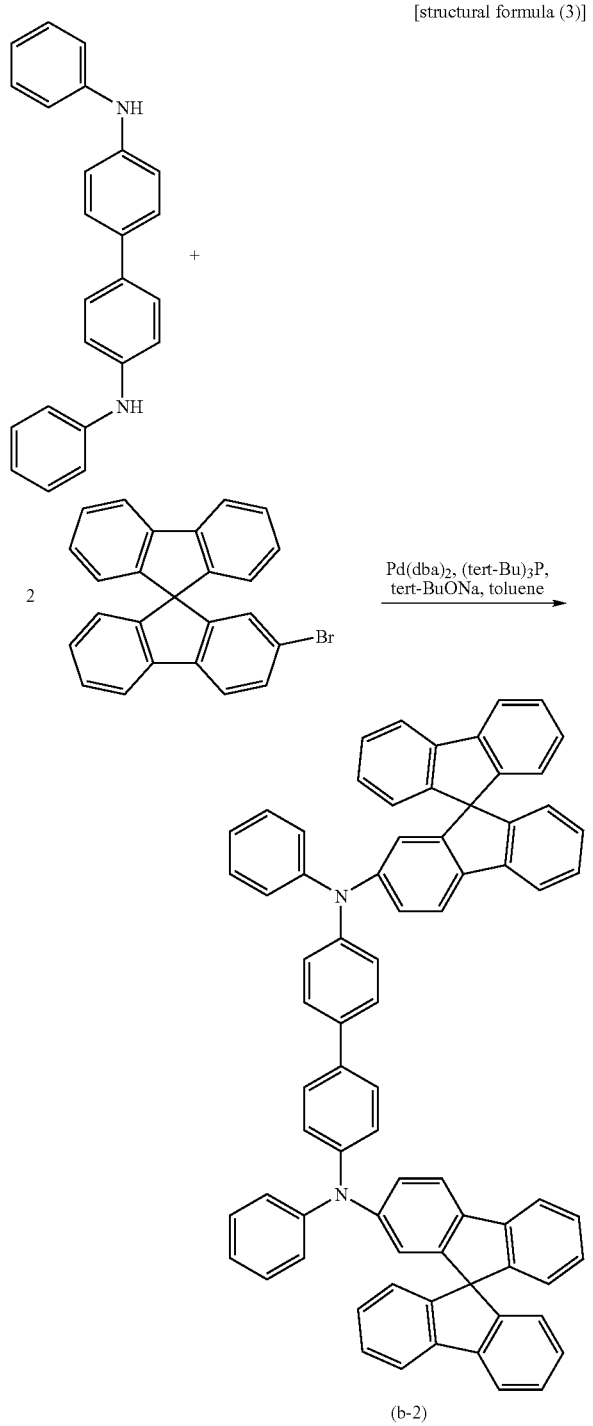

[structural formula (3)]

Figure 21:
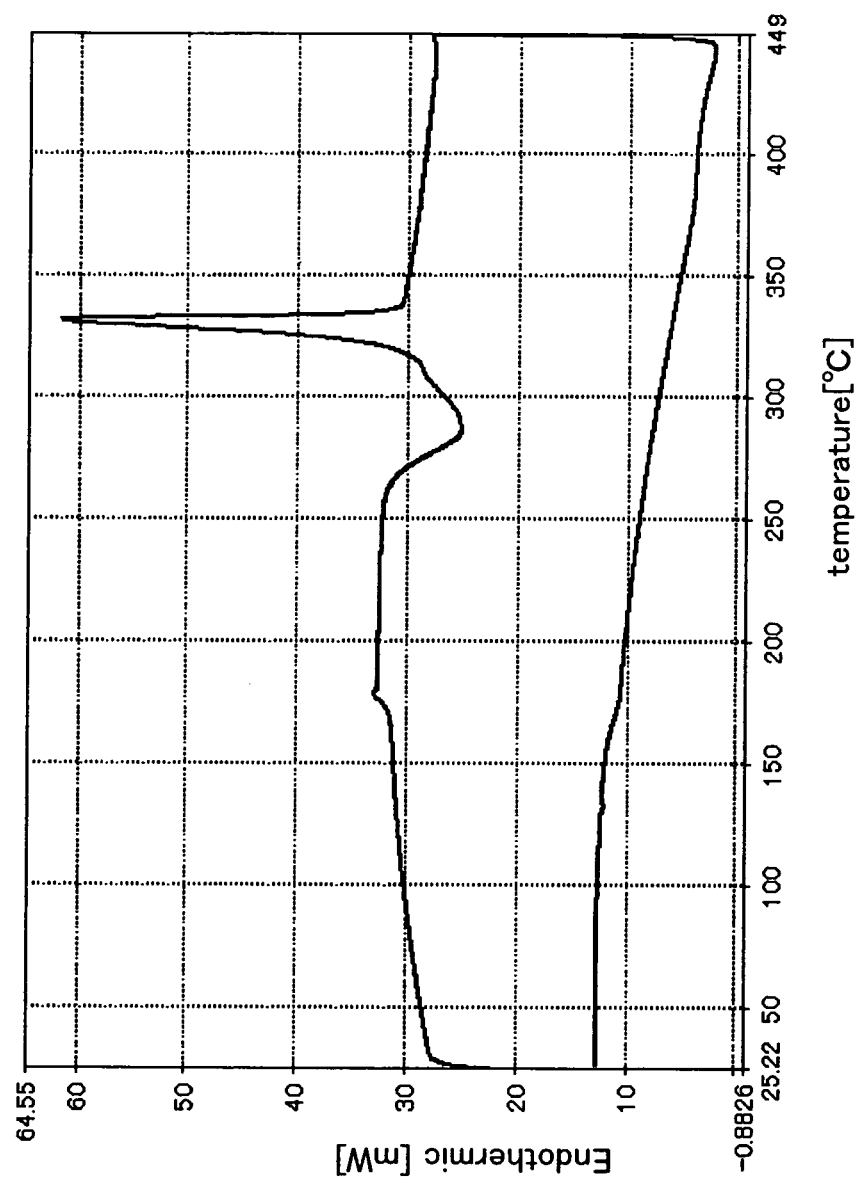
FIG. 21 is a graph showing a measurement result of N,N'-bis(spiro-9,9'-bifluorene-2-yl)-N,N'-diphenylbenzidine by differential scanning calorimetry.

Further, a glass-transition temperature, a crystallization temperature, and a melting point of the thus obtained compound were measured by using a differential scanning calorimetry (DSC) analyzer (#Pyris1 DSC, PerkinElmer, Inc.). The measurement using the DSC analyzer was performed in accordance with the following procedure. First, a test sample (which is the compound obtained above) was heated to 450° C. at the rate of temperature increase of 40° C./minute. Thereafter, the test sample was cooled at the rate of temperature decrease of 40° C./minute to made the test sample in a glass state. The test sample in the glass state was heated at the rate of temperature increase of 10° C./minute, and thus a measurement result shown in FIG. 21 was obtained. In FIG. 21, a horizontal axis represents temperature (° C.) whereas a vertical axis represents heat current (mW) (a rising portion indicates absorption of heat). According to the measurement result, it was known that the glass-transition temperature of the compound obtained above was 172° C. and the crystallization temperature thereof was 268° C. According to an intersection of a tangent at 312° C. and a tangent at 327 to 328° C., it was known that the melting point was 323 to 324° C. That is, the glass-transition temperature of the BSPB synthesized in this embodiment, was 150° C. or more, and preferably satisfies a range of 160° C. to 300° C., and the melting point of the BSPB was in a range of 180° C. to 400° C. Therefore, the BSPB has a high heat resistance property, and this is preferable.

As set forth above, the obtained compound has a high glass-transition temperature of 172° C. and exhibits a favorable heat resistance property. Also, in FIG. 21, a peak showing crystallization of the obtained compound is broad, and therefore, it was known that the obtained compound was a substance which was difficult to be crystallized.

Embodiment 2

In this embodiment, a light emitting element including a layer having low activation energy of the present invention, will be described.

First, indium tin oxide containing silicon was formed as a first electrode. A layer having low activation energy of the present invention, was formed thereover. In this embodiment, the layer having low activation energy was formed by co-evaporation of DNTPD, molybdenum oxide and rubrene. Here, the co-evaporation was controlled such that the concentration of molybdenum oxide satisfied the level of Table 3. Further, the layer having the low activation energy, was formed to have a thickness of 120 nm.

TABLE 3

|  | DNTPD:molybdenum oxide:rubrene (weight ratio) | Concentration of molybdenum oxide |
|---|---|---|
| Element 21 | 1:0.2:0.04 | 17 wt % |
| Element 22 | 1:0.3:0.04 | 23 wt % |
| Element 23 | 1:0.4:0.04 | 29 wt % |
| Element 24 | 1:0.5:0.04 | 33 wt % |

A film containing 4,4'-bis[N-(1-naphthyl)-N-phenylamino]biphenyl (abbreviation: α-NPD) with a thickness of 10 nm was formed over the layer having the low activation energy, as a hole transporting layer, by vacuum evaporation.

A film containing $Alq_3$ and coumarin 6 was formed by co-evaporation over the film containing α-NPD. The film containing $Alq_3$ and coumarin 6 was a light emitting layer and had a thickness of 40 nm. Further, the co-evaporation was carried out such that a weight ratio between $Alq_3$ and coumarin 6 was 1:0.015.

A film containing $Alq_3$ was formed over the light emitting layer to have a thickness of 15 nm, as an electron transporting layer. A film containing lithium fluoride was formed to have a thickness of 1 nm, as an electron injecting layer. A film containing Al was formed to have a thickness of 200 nm, as a second electrode. Thus, the light emitting elements 21 to 24 were manufactured.

Figure 22:
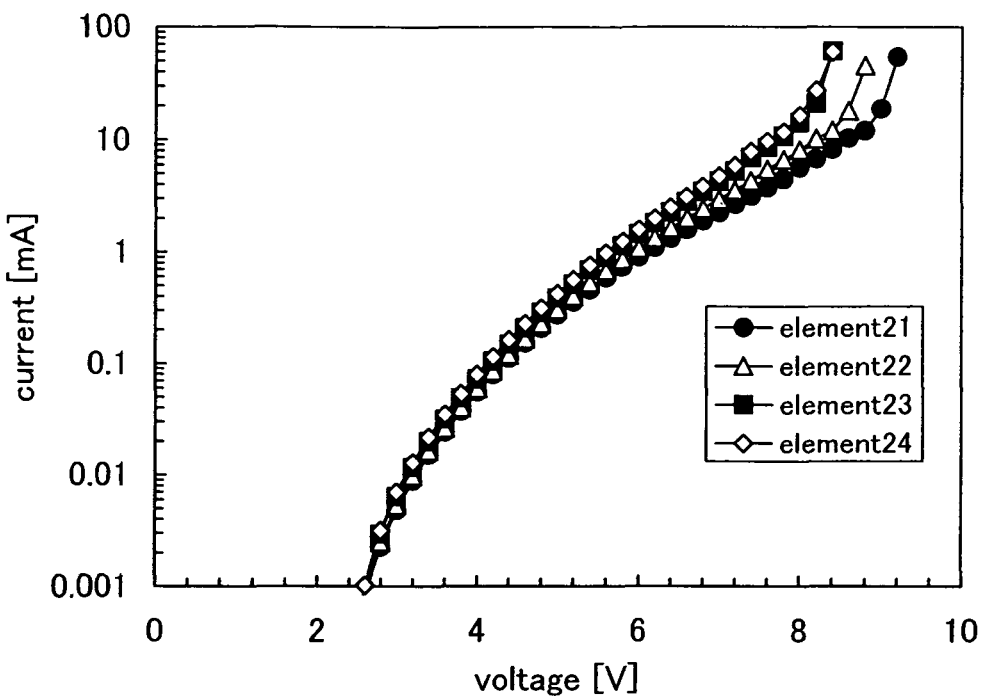
FIG. 22 is a graph showing a current-voltage characteristic of a light emitting element, which has a layer containing DNTPD and molybdenum oxide.

Current-voltage characteristics of the elements 21 to 24 manufactured above, are shown in FIG. 22. As shown in FIG. 22, it is known that as the more the concentration of molybdenum oxide was increased, the easier the current flowed.

Figure 23:
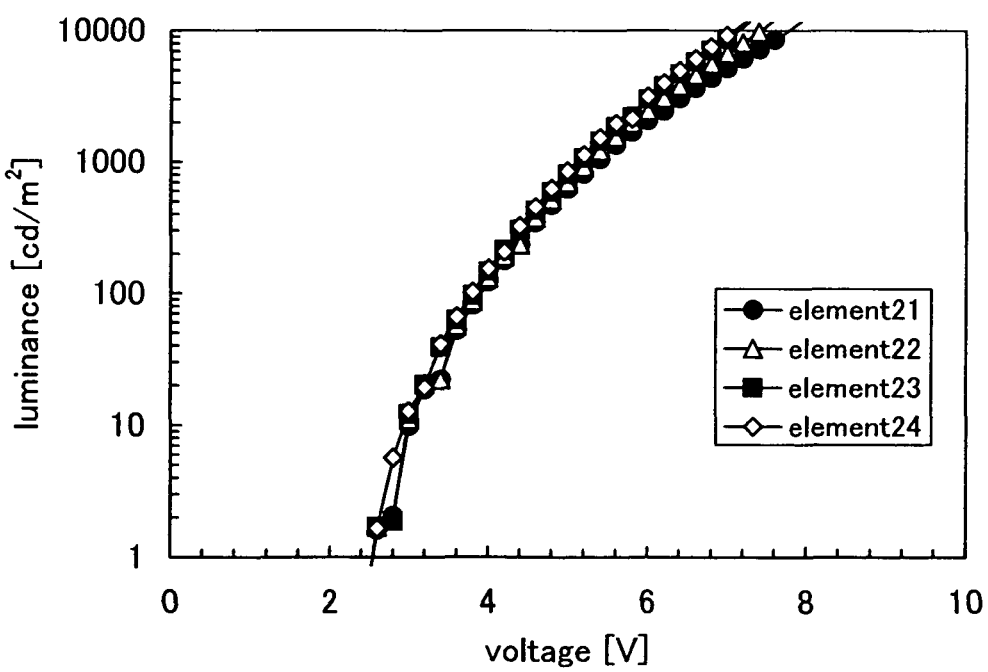
FIG. 23 is a graph showing a luminance-voltage characteristic of a light emitting element, which has a layer containing DNTPD and molybdenum oxide.

In addition, luminance-voltage characteristics of the elements 21 to 24 are shown in FIG. 23. According to FIG. 23, it is known that as the more the concentrate of molybdenum oxide was increased, the higher the luminance emitted. That is, when current efficiency of each element is constant, it is known that the current flows easily.

Embodiment 3

In this embodiment, a light emitting element including a layer having low activation energy of the present invention, will be described.

First, indium tin oxide containing silicon was formed as a first electrode. A layer having low activation energy of the present invention, was formed over the first electrode. In this embodiment, the layer having the low activation energy, was formed by co-evaporation of DNTPD, molybdenum oxide and rubrene. Here, the co-evaporation was controlled such that the concentration of molybdenum oxide satisfied the level of Table 3. Further, the layer having the low activation energy, was formed to have a thickness of 120 nm.

TABLE 4

|  | DNTPD:molybdenum oxide:rubrene (weight ratio) | Concentration of molybdenum oxide |
| --- | --- | --- |
| Element 31 | 1:0.33:0.02 | 24 wt % |
| Element 32 | 1:0.67:0.02 | 40 wt % |
| Element 33 | 1:1.00:0.02 | 50 wt % |
| Element 34 | 1:1.33:0.02 | 57 wt % |

A film containing α-NPD was formed by vacuum evaporation to have a thickness of 10 nm as a hole transporting layer, over the layer having the low activation energy.

A film containing $Alq_3$ and coumarin 6 was formed over the film containing α-NPD by co-evaporation. The film containing $Alq_3$ and coumarin 6 was a light emitting layer, and had a thickness of 37.5 nm. Further, the co-evaporation was controlled such that a weight ratio between $Alq_3$ and coumarin 6 became 1:0.005.

A film containing $Alq_3$ was formed to have a thickness of 37.5 nm as an electron transporting layer, over the light emitting element. Further, a film containing lithium fluoride was formed to have a thickness of 1 nm as an electron injecting layer. Then, a film containing Al was formed as a second electrode. Thus, light emitting elements 31 to 34 were manufactured in the same manner.

Figure 24:
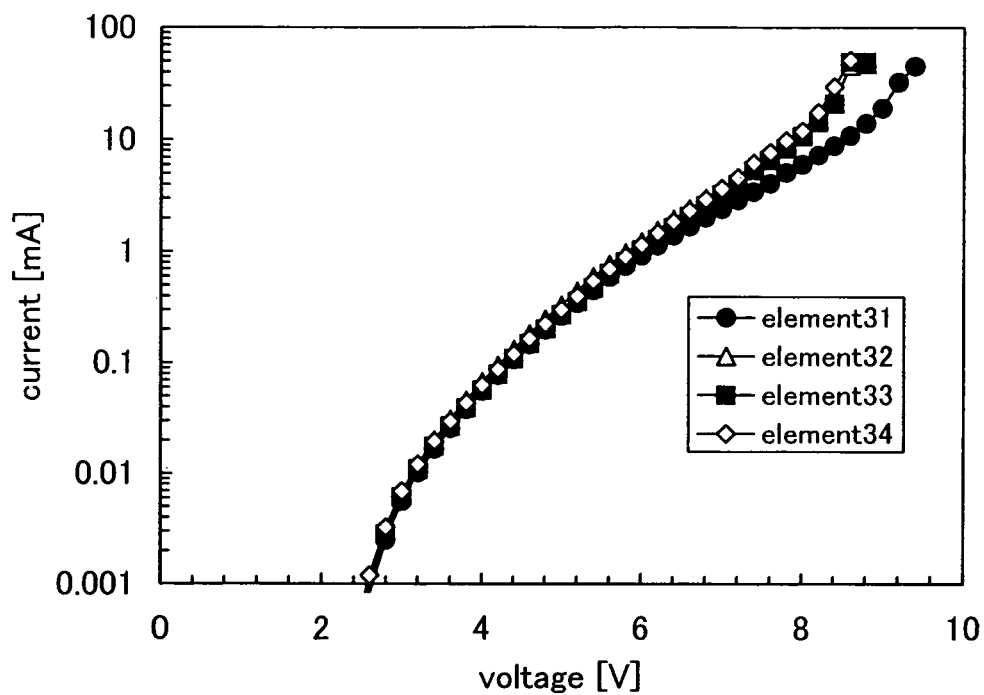
FIG. 24 is a graph showing a current-voltage characteristic of a light emitting element, which has a layer containing DNTPD and molybdenum oxide.

Current-voltage characteristics of the elements 31 to 34 manufactured above, are shown in FIG. 24. According to FIG. 24, it is known that the higher the concentration of molybdenum oxide was, the easier current flowed. Further, it is known that in the case of the elements 32, 33 and 34 whose the concentration of molybdenum oxide is 40 wt % or more, there are almost no variations in the current-voltage characteristics. Therefore, it is known that in the case where DNTPD is used for the layer having the low activation energy, when the concentration of molybdenum oxide is set to be 40 wt %, which effectively contributes to reduction in driving voltage of a light emitting element.

Figure 25:
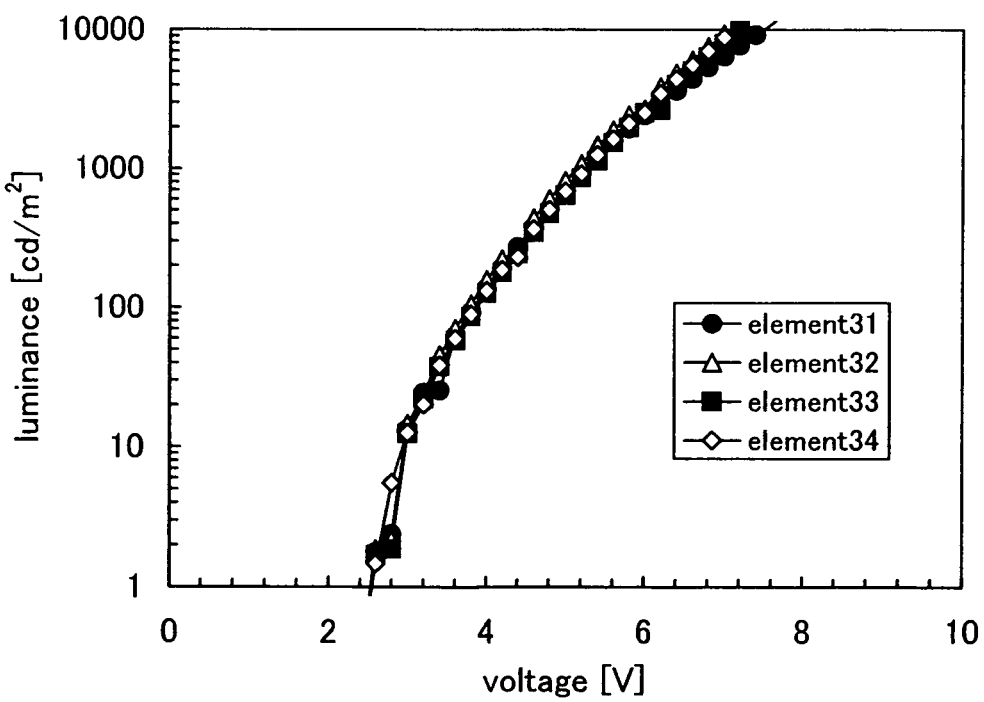
FIG. 25 is a graph showing a luminance-voltage characteristic of a light emitting element, which has a layer containing DNTPD and molybdenum oxide.

In addition, luminance-voltage characteristics of the elements 31 to 34 are shown in FIG. 25. According to FIG. 25, it is known that there are almost no differences in luminance-voltage characteristics of the respective elements, however, the luminance-voltage characteristic of the element 31 is slightly shifted toward a high voltage side.

What is claimed is:

1. A light emitting element comprising:
an anode;
a first layer over and in contact with the anode;
a light emitting layer over the first layer;
a second layer over the light emitting layer; and
a cathode over the second layer,
wherein each of the first layer and the second layer has a laminated structure comprising a first mixed layer and a second mixed layer,
wherein the first mixed layer comprises a first organic material and molybdenum oxide, and
wherein the second mixed layer comprises a second organic material and molybdenum oxide.

2. The light emitting element according to claim 1, wherein activation energy of electrical conductivity of each of the first layer and the second layer is 0.01 eV or more and less than 0.30 eV.

3. The light emitting element according to claim 1, wherein a concentration of the molybdenum oxide is 5 wt % to 95 wt %.

4. The light emitting element according to claim 1, wherein each of the first mixed layer and the second mixed layer has an absorption peak in a visible light region.

5. The light emitting element according to claim 4, wherein the first organic material is any one of N,N'-bis(spiro-9,9'-bifluoren-2-yl)-N,N'-diphenylbenzidine and 4,4'-bis[N-(4-biphenylyl)-N-phenylamino]biphenyl.

6. The light emitting element according to claim 1, wherein the second layer is in direct contact with the cathode.

7. A light emitting device comprising:
a light emitting element, the light emitting element comprising:
an anode;
a first layer over and in contact with the anode;
a light emitting layer over the first layer;
a second layer over the light emitting layer; and
a cathode over the second layer,
wherein each of the first layer and the second layer has a laminated structure comprising a first mixed layer and a second mixed layer,
wherein the first mixed layer comprises a first organic material and molybdenum oxide, and
wherein the second mixed layer comprises a second organic material and molybdenum oxide.

8. The light emitting device according to claim 7, wherein activation energy of electrical conductivity of each of the first layer and the second layer is 0.01 eV or more and less than 0.30 eV.

9. The light emitting device according to claim 7, wherein a concentration of the molybdenum oxide is 5 wt % to 95 wt %.

10. The light emitting device according to claim 7, wherein each of the first mixed layer and the second mixed layer has an absorption peak in a visible light region.

11. The light emitting device according to claim 10, wherein the first organic material is any one of N,N'-bis(spiro-9,9'-bifluoren-2-yl)-N,N'-diphenylbenzidine and 4,4'-bis[N-(4-biphenylyl)-N-phenylamino]biphenyl.

12. The light emitting device according to claim 7, wherein the second layer is in direct contact with the cathode.

13. An electronic appliance comprising:
a light emitting element, the light emitting element comprising:
  an anode;
  a first layer over and in contact with the anode;
  a light emitting layer over the first layer;
  a second layer over the light emitting layer; and
  a cathode,
wherein each of the first layer and the second layer has a laminated structure comprising a first mixed layer and a second mixed layer,
wherein the first mixed layer comprises a first organic material and molybdenum oxide, and
wherein the second mixed layer comprises a second organic material and molybdenum oxide.

14. The electronic appliance according to claim 13, wherein activation energy of electrical conductivity of each of the first layer and the second layer is 0.01 eV or more and less than 0.30 eV.

15. The electronic appliance according to claim 13, wherein a concentration of the molybdenum oxide is 5 wt % to 95 wt %.

16. The electronic appliance according to claim 13, wherein each of the first mixed layer and the second mixed layer has an absorption peak in a visible light region.

17. The electronic appliance according to claim 16, wherein the first organic material is any one of N,N'-bis(spiro-9,9'-bifluoren-2-yl)-N,N'-diphenylbenzidine and 4,4'-bis[N-(4-biphenylyl)-N-phenylamino]biphenyl.

18. The electronic appliance according to claim 13, wherein the second layer is in direct contact with the cathode.

* * * * *